United States Patent
Diehl et al.

(10) Patent No.: US 12,434,330 B1
(45) Date of Patent: Oct. 7, 2025

(54) LASER-BASED SURFACE PROCESSING FOR SEMICONDUCTOR WORKPIECE

(71) Applicant: Wolfspeed, Inc., Durham, NC (US)

(72) Inventors: Devon Michael Diehl, Durham, NC (US); Joshua Venton Negley, Hillsborough, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/628,223

(22) Filed: Apr. 5, 2024

(51) Int. Cl.
| | |
|---|---|
| *H01L 25/16* | (2023.01) |
| *B23K 26/03* | (2006.01) |
| *B23K 26/08* | (2014.01) |
| *B23K 26/40* | (2014.01) |
| *H01L 21/02* | (2006.01) |
| *B23K 101/40* | (2006.01) |
| *B23K 103/00* | (2006.01) |

(52) U.S. Cl.
CPC ............ *B23K 26/40* (2013.01); *B23K 26/032* (2013.01); *B23K 26/0869* (2013.01); *H01L 21/02013* (2013.01); *B23K 2101/40* (2018.08); *B23K 2103/56* (2018.08)

(58) Field of Classification Search
None
See application file for complete search history.

(56) References Cited

U.S. PATENT DOCUMENTS

| | | |
|---|---|---|
| 5,643,472 A | 7/1997 | Engelsberg et al. |
| 6,048,588 A | 4/2000 | Engelsberg |
| 7,109,521 B2 | 9/2006 | Hallin et al. |
| 7,173,285 B2 | 2/2007 | Hallin et al. |
| 7,226,805 B2 | 6/2007 | Hallin et al. |
| 7,396,410 B2 | 7/2008 | Hallin et al. |
| 7,601,986 B2 | 10/2009 | Hallin et al. |
| 9,279,192 B2 | 3/2016 | Hansen et al. |

(Continued)

FOREIGN PATENT DOCUMENTS

| | | |
|---|---|---|
| CN | 105933685 A | 9/2016 |
| CN | 205864631 U | 1/2017 |

(Continued)

OTHER PUBLICATIONS

Aminoroaya et al., "A Review of Dental Composites: Challenges, Chemistry Aspects, Filler Influences, and Future Insights", Composites Part B: Engineering, vol. 216, No. 108852, 2021, pp. 1-23.

(Continued)

*Primary Examiner* — Steven B Gauthier
*Assistant Examiner* — Lamont B Koo
(74) *Attorney, Agent, or Firm* — Dority & Manning, P.A.

(57) ABSTRACT

Systems and methods for laser-based surface processing operations on a wide bandgap semiconductor wafer, such as a silicon carbide semiconductor wafer, are provided. In one example, a method includes removing a wide bandgap semiconductor wafer from a boule using a removal process. The method includes ablating, with one or more lasers, an exposed surface resulting from the removal process to remove material from the exposed surface, wherein ablating, with one or more lasers, the exposed surface reduces a thickness of semiconductor material (e.g., by about 25 microns or greater).

21 Claims, 17 Drawing Sheets

(56) References Cited

U.S. PATENT DOCUMENTS

| | | |
|---|---|---|
| 10,002,760 B2 | 6/2018 | Hansen et al. |
| 10,226,835 B2 | 3/2019 | Matsuura |
| 10,319,593 B2 | 6/2019 | Hirata et al. |
| 10,319,594 B2 | 6/2019 | Hirata |
| 10,505,193 B2 | 12/2019 | Tour et al. |
| 10,562,130 B1 | 2/2020 | Donofrio et al. |
| 10,576,585 B1 | 3/2020 | Donofrio et al. |
| 10,611,052 B1 | 4/2020 | Bubel et al. |
| 10,896,815 B2 | 1/2021 | Seddon et al. |
| 10,903,078 B2 | 1/2021 | Schulze et al. |
| 11,034,056 B2 | 6/2021 | Bubel et al. |
| 11,219,966 B1 | 1/2022 | Donofrio et al. |
| 11,289,378 B2 | 3/2022 | Schneider et al. |
| 11,373,859 B2 | 6/2022 | Seddon et al. |
| 11,519,098 B2 | 12/2022 | Khlebnikov et al. |
| 11,654,596 B2 | 5/2023 | Bubel et al. |
| 11,772,201 B2 | 10/2023 | Richter et al. |
| 11,826,846 B2 | 11/2023 | Donofrio et al. |
| 11,901,231 B2 | 2/2024 | Nomoto et al. |
| 11,911,842 B2 | 2/2024 | Donofrio et al. |
| 12,054,850 B2 | 8/2024 | Khlebnikov et al. |
| 12,070,875 B2 | 8/2024 | Bubel et al. |
| 2005/0205871 A1 | 9/2005 | Hallin et al. |
| 2005/0205872 A1 | 9/2005 | Hallin et al. |
| 2006/0032434 A1 | 2/2006 | Mueller et al. |
| 2006/0057850 A1 | 3/2006 | Britt et al. |
| 2006/0243985 A1 | 11/2006 | Hallin et al. |
| 2007/0101930 A1 | 5/2007 | Hallin et al. |
| 2007/0105349 A1 | 5/2007 | Hallin et al. |
| 2010/0311225 A1 | 12/2010 | Sekiya |
| 2014/0024199 A1 | 1/2014 | Qiu et al. |
| 2017/0025275 A1 | 1/2017 | Hirata et al. |
| 2017/0025276 A1 | 1/2017 | Hirata |
| 2017/0204532 A1 | 7/2017 | Land |
| 2018/0290893 A1 | 10/2018 | Dukes et al. |
| 2019/0326117 A1 | 10/2019 | Seddon et al. |
| 2019/0337100 A1 | 11/2019 | Richter et al. |
| 2019/0362960 A1 | 11/2019 | Seddon et al. |
| 2019/0362972 A1 | 11/2019 | Schulze et al. |
| 2020/0361121 A1 | 11/2020 | Bubel et al. |
| 2020/0398381 A1 | 12/2020 | Richter et al. |
| 2021/0118666 A1 | 4/2021 | Seddon et al. |
| 2021/0170632 A1 | 6/2021 | Bubel et al. |
| 2021/0198804 A1 | 7/2021 | Khlebnikov et al. |
| 2021/0375620 A1* | 12/2021 | Ahmed ............... H01L 25/50 |
| 2022/0126395 A1 | 4/2022 | Donofrio et al. |
| 2022/0189768 A1 | 6/2022 | Khlebnikov et al. |
| 2022/0254916 A1 | 8/2022 | Miyazato et al. |
| 2022/0403552 A1 | 12/2022 | Leonard et al. |
| 2023/0133459 A1 | 5/2023 | Tanaka et al. |
| 2023/0241803 A1 | 8/2023 | Bubel et al. |
| 2024/0113235 A1 | 4/2024 | Potera |
| 2024/0189940 A1 | 6/2024 | Donofrio et al. |
| 2024/0266419 A1 | 8/2024 | King et al. |
| 2024/0274660 A1 | 8/2024 | Van Brunt et al. |
| 2024/0352622 A1 | 10/2024 | Khlebnikov et al. |
| 2024/0367348 A1 | 11/2024 | Bubel et al. |
| 2024/0413129 A1* | 12/2024 | Choi ............... H01L 21/6835 |

FOREIGN PATENT DOCUMENTS

| | | |
|---|---|---|
| CN | 115338546 A | 11/2022 |
| WO | WO 2017/053883 A | 3/2017 |

OTHER PUBLICATIONS

Chen et al., "Effect of Laser Incidence Angle on the Femtosecond Laser Ablation Characteristics of Silicon Carbide Ceramics", Optics and Lasers in Engineering, vol. 172, No. 107849, 2024, pp. 1-18.

Cho et al., "Dental Resin Composites: A Review on Materials to Product Realizations", Composites Part B: Engineering, vol. 230, No. 109495, 2022, 65 pages.

Kinashi et al., "UV-Assisted Deposition of TEOS SiO2 Films Using the Spin-Coating Method", Applied Surface Science, vol. 79-80, 1994, pp. 332-337.

Li et al., "Surface Micromorphology and Nanostructures Evolution in Hybrid Laser Processes of Slicing and Polishing Single Crystal 4H—SiC", Journal of Materials Science & Technology, vol. 184, 2024, pp. 235-244.

Theissmann et al., "High Performance Low Temperature Solution-Processed Zinc Oxide Thin Film Transistor", Thin Solid Films, vol. 519, Issue 16, 2011, pp. 5623-5628.

Moszner et al., "New Developments of Polymeric Dental Composites", Progress in Polymer Science, vol. 26, Issue 4, 2001, pp. 535-576.

Aixtron, "The First Domestic Silicon Carbide Ingot Laser Stripping Equipment was put into Production", Aug. 28, 2024, Morning News, https://www.compoundsemiconductorchina.net/industry-news.asp?id=6308, retrieved on Sep. 10, 2024 with machine translation, 4 pages.

Gie, "HGL Series Wafer Laser Stealth Cutting Equipment", Henan General Intelligent Equipment Co., Ltd., https://www.chngie.com/copy_HGL.html, retrieved on Sep. 10, 2024 with machine translation, 6 pages.

Geng et al., "Slicing of 4H—SiC Wafers Combining Ultrafast Laser Irradiation and Bandgap-Selective Photo-Electrochemical Exfoliation", Advanced Materials Interfaces, vol. 10, No. 2300200, 2023, pp. 1-7.

Kim et al., "4H—SiC Wafer Slicing by Using Femtosecond Laser Double-Pulses", Optical Materials Express, vol. 7, No. 7, Jul. 1, 2017, pp. 2450-2460.

Zhang et al., "A Review of Femtosecond Laser Processing of Silicon Carbide", MDPI Micromachines, vol. 15, No. 639, May 10, 2024, pp. 1-26.

* cited by examiner

LASER-BASED SURFACE PROCESSING FOR SEMICONDUCTOR WORKPIECE

FIELD

The present disclosure relates generally to semiconductor fabrication, and more particularly to surface processing of semiconductor workpieces, such as wide bandgap semiconductor workpiece, such as silicon carbide semiconductor workpieces.

BACKGROUND

Power semiconductor devices are used to carry large currents and support high voltages. A wide variety of power semiconductor devices are known in the art including, for example, transistors, diodes, thyristors, power modules, discrete power semiconductor packages, and other devices. For instance, example semiconductor devices may be transistor devices such as Metal Oxide Semiconductor Field Effect Transistors ("MOSFET"), bipolar junction transistors ("BJTs"), Insulated Gate Bipolar Transistors ("IGBT"), Gate Turn-Off Transistors ("GTO"), junction field effect transistors ("JFET"), high electron mobility transistors ("HEMT") and other devices. Example semiconductor devices may be diodes, such as Schottky diodes or other devices.

Power semiconductor devices may be packaged into various semiconductor device packages, such as discrete semiconductor device packages and power modules. Power modules may include one or more power devices and other circuit components and can be used, for instance, to dynamically switch large amounts of power through various components, such as motors, inverters, generators, and the like.

Semiconductor devices may be fabricated from wide bandgap semiconductor materials, such as silicon carbide and/or Group III nitride-based semiconductor materials. The fabrication process for power semiconductor devices may require processing of wide bandgap semiconductor wafers, such as silicon carbide semiconductor wafers.

SUMMARY

Aspects and advantages of embodiments of the present disclosure will be set forth in part in the following description, or may be learned from the description, or may be learned through practice of the embodiments.

One example aspect of the present disclosure is directed to a method. The method includes removing a wide bandgap semiconductor wafer from a boule using a removal process. The method includes ablating, with one or more lasers, an exposed surface resulting from the removal process to remove material from the exposed surface, wherein ablating, with one or more lasers, the exposed surface reduces a thickness of semiconductor material by about 25 microns or greater.

Another example aspect of the present disclosure is directed to a method of processing an exposed surface of a semiconductor material. The method includes obtaining data indicative of a workpiece property. The method includes determining one or more laser parameters based on the data indicative of the workpiece property. The method includes removing semiconductor material from the exposed surface using one or more lasers based at least in part on the laser parameters.

Another example aspect of the present disclosure is directed to a method of processing an exposed surface of semiconductor material. The method includes providing a semiconductor workpiece having an exposed surface. The method includes providing emission of one or more lasers to the exposed surface to remove material from the exposed surface such that the exposed surface has a surface roughness in a range of about 0.5 nanometer to about 180 nanometers.

Another example aspect of the present disclosure is directed to a system for processing an exposed surface of a semiconductor material. The system includes a laser source configured to emit a laser to remove material from an exposed surface of a semiconductor workpiece. The system includes at least one translation stage operable to impart relative motion between the exposed surface of the semiconductor workpiece and the laser. The system includes a sensor operable to obtain data indicative of a workpiece property. The system includes a controller configured to perform operations. The operations include determining one or more laser parameters based on the data indicative of the workpiece property, The operations include controlling the laser to remove material from the exposed surface based at least in part on the laser parameters.

Another example aspect of the present disclosure is directed to a system for processing an exposed surface of a semiconductor material. The system includes a first laser source configured to emit a first laser remove material from an exposed surface of a semiconductor structure. The system includes a second laser source configured to emit a second laser remove material from the exposed surface of the semiconductor structure. The system includes at least one translation stage operable to impart relative motion between the exposed surface of the semiconductor structure and the first laser and between the exposed surface of the semiconductor structure and the second laser. The first laser is associated with a first wavelength and the second laser is associated with a second wavelength that is different than the first wavelength.

Another example aspect of the present disclosure is directed to a system for forming a wide bandgap semiconductor wafer. The system includes a workpiece support configured to support a semiconductor workpiece. The system includes a first laser source configured to emit a first laser to remove a portion of semiconductor material from the semiconductor workpiece using a removal process. The system includes a second laser source configured to emit a second laser to ablate an exposed surface of the semiconductor workpiece resulting from the removal process.

Another example aspect of the present disclosure is directed to a semiconductor wafer. The semiconductor wafer includes silicon carbide. The semiconductor wafer includes a laser-defined surface. The laser-defined surface has a surface roughness in a range of about 0.5 nanometer to about 180 nanometers.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1:
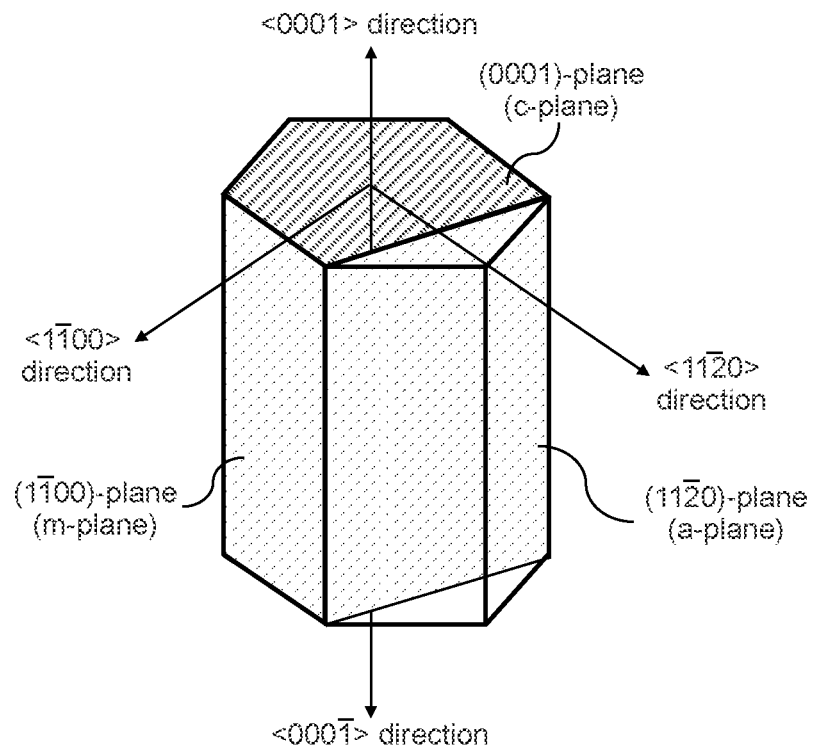
FIG. 1 is a first perspective view crystal plane diagram showing the coordinate system for a hexagonal crystal such as 4H—SiC.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Power semiconductor devices are often fabricated from wide bandgap semiconductor materials, such as silicon carbide or Group III-nitride based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures as wide bandgap semiconductor structures. Those of ordinary skill in the art, using the disclosures provided herein, will understand that the power semiconductor devices according to example embodiments of the present disclosure may be used with any semiconductor material, such as other wide bandgap semiconductor materials and other semiconductor materials (e.g., silicon), without deviating from the scope of the present disclosure. Example wide bandgap semiconductor materials include silicon carbide and the Group III-nitrides.

Power semiconductor devices may be fabricated using epitaxial layers formed on a semiconductor workpiece, such as a silicon carbide semiconductor wafer. Aspects of the present disclosure are discussed with reference to a semiconductor workpiece that is a semiconductor wafer that includes silicon carbide ("silicon carbide semiconductor wafer") for purposes of illustration and discussion. Those of ordinary skill in the art, using the disclosures provided herein, will understand that aspects of the present disclosure can be used with other semiconductor workpieces, such as other wide bandgap semiconductor workpieces. Other semiconductor workpieces may include carrier substrates, ingots, boules, polycrystalline substrates, monocrystalline substrates, bulk materials having a thickness of greater than 1 mm, such as greater than about 5 mm, such as greater than about 10 millimeters, such as greater than about 20 millimeters, such as greater than about 50 millimeters, such as greater than about 100 millimeters, such as greater than about 200 millimeters, etc.

In some examples, the semiconductor workpiece includes silicon carbide crystalline material. The silicon carbide crystalline material may have a 4H crystal structure, 6H crystal structure, or other crystal structure. The semiconductor workpiece can be an on-axis workpiece (e.g., end face parallel to the (0001) plane) or an off-axis workpiece (e.g., end face non-parallel to the (0001) plane).

Aspects of the present disclosure may make reference to a surface of the semiconductor workpiece. In some examples, the surface of the workpiece may be, for instance, a silicon face of the workpiece. In some examples, the surface of the workpiece may be, for instance, a carbon face of the workpiece.

An ingot or boule refers to a large portion of semiconductor material used in forming semiconductor substrates, commonly semiconductor wafers. A boule may be part of an epitaxially grown crystalline semiconductor material, for example, a wide bandgap semiconductor material. Specifically, in some examples, a boule may include a large portion of epitaxially grown silicon carbide (e.g., 4H silicon carbide) or Group III-nitride. A substrate or semiconductor wafer may be formed from a portion of semiconductor material removed from a boule. The terms "ingot" and "boule" may be used interchangeably in the present disclosure.

In some examples, a semiconductor wafer may be a solid semiconductor workpiece upon which semiconductor device fabrication may be implemented. A semiconductor wafer may be a homogenous material, such as silicon carbide, and may provide mechanical support for the formation and/or carrying of additional semiconductor layers (e.g., epitaxial layers), metallization layers, and other layers to form one or more semiconductor devices. In some examples, a semiconductor wafer may have a thickness in a range of about 0.5 micron to about 1000 microns, or greater.

A semiconductor wafer may be characterized by a plurality of surfaces. For example, a semiconductor wafer may have a "first major surface" and a "second major surface." The first major surface may be generally opposite the second major surface. The first and second major surfaces may be generally parallel to one another. A semiconductor wafer may also have a "side surface" corresponding to a surface extending between the two major surfaces. For example, the side surface may extend between the first major surface and the second major surface.

Power semiconductor device fabrication processes may include surface processing operations that are performed on the silicon carbide semiconductor wafer to prepare one or more surfaces of the silicon carbide semiconductor wafer for later processing steps, such as surface implantation, formation of epitaxial layers, metallization, etc. Example surface processing operations may include grinding operations, lapping operations, and polishing operations. Methods for surface processing of semiconductor wafers in semiconductor manufacturing may include grinding, lapping, and/or polishing the rough surfaces until a sufficient smoothness and/or thickness is achieved.

Grinding is a material removal process that is used to remove material from the semiconductor wafer. Grinding may be used to reduce a thickness of a semiconductor wafer. Grinding typically involves exposing the semiconductor wafer to an abrasive containing surface, such as grinding teeth on a grind wheel. Grinding may remove material of the semiconductor wafer through engagement with the abrasive surface.

Lapping is a precision finishing process that uses a loose abrasive in slurry form. The slurry typically includes coarser particles (e.g., largest dimension of the particles being greater than about 100 microns) to remove material from the semiconductor wafer. Lapping typically does not include engaging the semiconductor wafer with an abrasive-containing surface on the lapping tool (e.g., a wheel or disc having an abrasive-containing surface). Instead, the semiconductor wafer typically comes into contact with a lapping plate or a tile usually made of metal. Lapping typically provides better planarization of the semiconductor wafer relative to grinding.

Polishing is a process to remove imperfections and create a very smooth surface with a low surface roughness. Polishing may be performed using a slurry and a polishing pad. The slurry typically includes finer particles relative to lapping, but coarser particles relative to chemical mechanical planarization (CMP). Polishing typically provides better planarization of the semiconductor wafer relative to grinding.

CMP is a type of fine or ultrafine polishing, typically used to produce a smoother surface ready, for instance, for epitaxial growth of layers on the semiconductor wafer. CMP may be performed chemically and/or mechanically to remove imperfections and to create a very smooth and flat surface with low surface roughness. CMP typically involves changing the material of the semiconductor through a chemical process (e.g., oxidation) and removing the new material from the semiconductor wafer through abrasive contact with a slurry and/or other abrasive surface or polishing pad (e.g., oxide removal). In CMP, the abrasive elements in the slurry typically remove the product of the chemical process and do not remove the bulk material of the semiconductor wafer, often leaving very low subsurface damage.

Current methods for fabricating power semiconductor devices from semiconductor material boules may incur significant material losses and consumable tool losses and costs due to the structural properties of crystalline boules and current methods of separating or fracturing substrates or wafers from a boule. Methods for fabricating power semiconductor devices include forming a crystalline material boule, such as a silicon carbide boule, and separating portions of the boule to form substrates, such as silicon carbide semiconductor wafers. In some instances, boules may be formed to include doped regions with dopants within the crystalline material boule.

Methods for forming semiconductor wafers from boules may include, for instance, cutting thin layers (e.g., wafers) from the boule using wire saws. Another example removal process for forming semiconductor wafers from boules may include a laser-based removal process. Laser-based removal processes may include providing subsurface laser damage patterns to a boule to form weakened areas in the boule. Portions may then be separated from the boule along the weakened areas to produce semiconductor wafers. Separation processes may include, for example, ultrasonic fracturing, mechanical force fracturing, or other fracturing methods.

The separating (e.g., fracturing) process may produce a rough and uneven surface on both the boule and the crystalline material substrates separated from the boule. For instance, in a laser-based removal process, laser strength, depth, weakened area proximity to other weakened areas, and laser power may contribute to the formation of residual cracks and defects protruding outward from the weakened areas which, in turn, create the rough surface of the boule and the semiconductor wafers removed from the boules.

Semiconductor devices and device manufacturing may require smooth surfaces on a semiconductor workpiece. Accordingly, in some cases, before continuing with further separations of the boule or further manufacturing with the semiconductor workpiece, rough surface(s) may need to be subjected to surface processing operations. For instance, in some examples, the surface of the boule may be smoothed to allow for the formation of subsequent laser damage regions in the boule. Otherwise, a rough surface on the boule may lead to undesirable reflection/refraction of one or more laser(s) used during formation of the subsurface laser damage regions for removal of subsequent semiconductor wafers. Methods for surface processing of boules and substates (e.g., semiconductor wafers) in semiconductor manufacturing may include grinding, lapping, and/or polishing the rough surfaces until a sufficient smoothness is achieved.

In some instances, several grinding processes and/or other surface processing operations are performed to achieve sufficient smoothness. For instance, a coarse grinding process may reduce substantial irregularities or impurities and reduce wafer thickness and a fine grinding process may finalize the surface and achieve the sufficient smoothness for further fabrication processes (e.g., lapping and/or polishing).

Grinding methods may incur substantial time, material, and consumable tool loss and cost due to the structural properties of the crystalline materials used in semiconductor devices and smoothness requirements of semiconductor devices. Materials used in wide bandgap semiconductor devices, such as, for example, silicon carbide, have extreme rigidity and strength requiring expensive tools (e.g., with diamond abrasive elements) that are rapidly consumed. The grinding process also results in material losses from grinding away potential usable material to provide a sufficiently smooth surface for semiconductor device manufacturing.

Aspects of the present disclosure are directed to using a laser-based system for surface processing of the surfaces of semiconductor workpieces. For instance, aspects of the present disclosure are directed to a method for manufacturing a semiconductor wafer including removing a semiconductor wafer from a boule using a removal process (e.g., laser-based removal process or wire saw based removal process) and ablating, with one or more lasers, an exposed surface resulting from the removal process to remove material from the exposed surface (e.g., to reduce a thickness of the boule or the wafer by at least about 25 microns). In some examples, the exposed surface may be a surface of the wide bandgap semiconductor wafer removed from the boule. In some examples, the exposed surface may be a surface of the boule. As discussed previously, the removal process may include inducing a subsurface laser damage region in the boule, and separating a portion of the boule (e.g., the wafer or substrate) from the boule along the weakened region (e.g., subsurface laser damage region).

In some examples, the exposed surface of the boule may be ablated with one or more lasers to smooth the exposed surface of the boule prior to implementing another removal process (e.g., laser-based removal process) to separate another semiconductor wafer from the boule. This will reduce interference (e.g., undesirable reflection, refraction, etc.) caused by a roughened surface of the boule with the subsequent laser(s) used during the subsequent removal process.

In some embodiments, ablating an exposed surface may include implementing a coarse laser ablation process with one or more lasers. In some embodiments, ablating an exposed surface may additionally or alternatively include implementing a fine laser ablation process with the one or more lasers.

For example, a coarse laser ablation process may remove material from the surface and produce a surface with a surface roughness of about 20 nanometers and about 65 microns, such as about 20 nanometers and 10 microns, such as about 25 nanometers and 1 micron, such as between about 25 nanometers and about 150 nanometers. In addition, in some examples, a coarse laser ablation process may reduce a thickness of the workpiece by about 5 microns to about 500 microns, such as by about 5 microns to about 100 microns, such as by about 25 microns to about 80 microns, such as by about 40 microns to about 60 microns.

A fine laser ablation process may remove material from the surface and produce a surface with a surface roughness between about 0.5 nanometers to about 180 nanometers, such as about 0.5 nanometers to about 125 nanometers, such as about 1 nanometer and about 100 nanometers, such as about 2 nanometers and about 50 nanometers. In addition, in some examples, a fine laser ablation process may reduce a thickness of the wafer and/or the boule by about by about 0.1 micron to about 50 microns, such as by about 1 micron to about 50 microns, such as by about 1 micron to about 25 microns.

Aspects of the present disclosure refer to and/or claim a "surface roughness" of a surface. As used herein, unless otherwise specifically noted, the surface roughness is measured as "areal average roughness" Sa. When the present disclosure or claims refer to a surface having a surface roughness being within a range of values, a surface has a surface roughness in the range of values if any 1 millimeter by 1 millimeter area on the surface includes a surface roughness Sa within the specified range of values or if any 1 millimeter by 1 millimeter area on the surface includes a surface roughness Sz (maximum height) within the specified range of values.

As an example, a surface has a surface roughness in a range of 0.5 nm to 180 nm if any 1 millimeter×1 millimeter area on the surface has a surface roughness Sa in the range of 0.5 nanometers to 180 nanometers or if any 1 millimeter×1 millimeter area on the surface has a surface roughness Sz in the range of 0.5 nanometers to 180 nanometers. For the sake of clarity, it is not required that the entire surface have the surface roughness in the specified range of values. Only a single 1 millimeter×1 millimeter area on the surface is required to have a surface roughness in the specified range of values (e.g., either Sa or Sz) for the surface to be considered to have a surface roughness in the specified range of values.

In some examples, a coarse laser ablation process may be performed with one or more lasers having first laser parameters. The fine laser ablation process may be performed with one or more lasers having second laser parameters. The first laser parameters may be different from the second laser parameters. The first laser parameters and the second laser parameters may include, for instance, laser power, laser wavelength, laser pulse duration, focusing depth, translation speed, laser incidence angle, and the like.

In some instances, a coarse ablation process may be performed by a first laser from a first laser source and a fine ablation process may be performed by a second laser from a second laser source. Alternatively, both the coarse ablation process and the fine ablation process may be performed by the same laser from the same laser source. In some embodiments, two or more lasers may be configured to operate using different laser parameters (e.g., different laser wavelengths and/or pulse durations). For instance, a first laser performing a coarse laser ablation process may have a longer wavelength relative to a second laser performing a fine laser ablation process. For example, the first laser may be an infrared laser and the second laser may be an ultraviolet laser.

In some examples, the coarse laser ablation process may be implemented in accordance with the following laser parameters:

Laser wavelength: about 500 nanometers to about 1100 nanometers, such as about 532 nanometers, such as about 1064 nanometers, such as about 1080 nanometers;

Pulse frequency: about 1 kilohertz to about 200 kilohertz, such as about 10 kilohertz to about 150 kilohertz, such as about 20 kilohertz to about 100 kilohertz;

Laser power: 0.1 watt to about 500 watts, such as about 0.5 watt to about 100 watts, such as about 1 watt to about 40 watts, such as about 1 watt to about 10 watts;

Laser pulse duration: about 0.1 femtoseconds to about 300 nanoseconds; such as about 1 femtosecond to about 150 nanoseconds, such as about 1 femtosecond to about 100 nanoseconds;

Translation speed: about 1 millimeter per second to about 2 meters per second, such as about 1 millimeter per second to about 1 meter per second Focusing depth: about 0 microns to about 2000 microns (beneath the surface of the workpiece), such as about 0 microns to about 1000 microns (beneath the surface of the workpiece), such as about 1 micron to about 100 microns (beneath the surface of the workpiece).

Laser Pulse Energy: about 1 nanojoule to about 2 joules, such as about 10 nanojoules to about 200 millijoules.

In some examples, the fine laser ablation process may be implemented in accordance with different laser parameters relative to the coarse laser ablation process. For instance, the fine laser ablation process may be implemented at shorter wavelengths, shorter pulse durations, lower pulse frequency, lower laser power, and/or smaller focusing depth (beneath the surface of the workpiece) relative to the coarse laser ablation process. In some examples, the fine laser ablation process may be implemented in accordance with the following laser parameters:

Laser wavelength: about 190 nanometers to about 600 nanometers, such as about 190 nanometers to about 300 nanometers, such as about 193 nanometers, such as about 200 nanometers, such as about 248 nanometers, such as about 266 nanometers, such as about 343 nanometers, such as about 355 nanometers, such as about 405 nanometers;

Pulse frequency: about 1 kilohertz to about 200 kilohertz, such as about 1 kilohertz to about 150 kilohertz, such as about 1 kilohertz to about 100 kilohertz, such as about 1 kilohertz to about 50 kilohertz;

Laser power: 0.1 watt to about 10 watts, such as about 0.5 watts to about 10 watts, such as about 1 watt to about 10 watts;

Laser pulse duration: about 0.1 femtoseconds to about 1 nanoseconds; such as about 1 femtosecond to about 500 picoseconds;

Translation speed: about 1 millimeter per second to about 2 meters per second, such as about 1 millimeter per second to about 1 meter per second Focusing depth: about 0 microns to about 10 microns (beneath the surface of the workpiece), such as about 0 microns to about 5 microns (beneath the surface of the workpiece), such as about 0 microns to about 1 micron (beneath the surface of the workpiece).

Laser Pulse Energy: about 1 nanojoule to about 2 joules, such as about 10 nanojoules to about 200 millijoules.

In some examples, to perform laser-based surface processing operations (e.g., laser ablation process(es)) relative motion may be imparted between the exposed surface and the one or more lasers ablating the exposed surface. It should be appreciated that both moving the one or more lasers relative to the exposed surface (e.g., through a translation stage and/or one or more optical devices, such as lenses, mirrors, etc.) and moving the exposed surface relative to the one or more lasers may fall within the scope of the present disclosure.

During a laser-based surface processing operation according to examples of the present disclosure, the one or more lasers may, for example, scan at least 85% of the exposed surface through relative motion between the one or more lasers and the exposed surface, such as at least 95% of the exposed surface, such as at least 99% of the exposed surface.

The surface may be scanned by the lasers in one or more passes. Each pass of the laser may have a scan dimension (e.g., spot size) representative of a dimension of the laser on the exposed surface. The scan dimension (e.g., spot size) may be in a range of, for instance, 10 microns to about 25 millimeters, such as about 500 microns to about 25 millimeters, such as about 1 millimeter to about 25 millimeter, such as about 1 millimeter to about 10 millimeters. In some examples, there may be a distance between passes of each laser. The distance between each scan or pass may be, for instance, in a range of about 0 millimeters to about 1 millimeter, such as about 0 millimeters to about 500 microns. In some examples, there may be no distance between passes of each laser. In some examples, there may be overlap between scans or passes of the laser on the surface. In some examples, there may be about 0% to about 50% overlap of the scan dimension between passes of each laser.

The lasers may scan the surface in any suitable pattern. Example laser scan patterns are provided in FIGS. 16-22 below.

In some examples, the laser-based surface processing operation (e.g., laser ablation process(es)) may be performed on the exposed surface at a fixed focal depth at or near the exposed surface. In some examples, the fixed focal depth may be in a range of about 0 microns to about 2000 microns. For instance, for a coarse laser ablation process, the fixed focal depth may be in a range of, for instance, about 0 microns to about 2000 microns, such as about 0 microns to about 1000 microns, such as about 1 micron to about 100 microns. For a fine laser ablation process, the fixed focal depth may be in a range of, for instance, about 0 microns to about 10 microns (beneath the surface of the workpiece), such as about 0 microns to about 5 microns (beneath the surface of the workpiece), such as about 0 microns to about 1 micron (beneath the surface of the workpiece).

In some examples, the laser-based surface processing operation may be performed in multiple passes of the laser over the same position of the workpiece at the fixed focal depth to achieve desired materials removal or thickness reduction in the exposed surface. For instance, multiple passes of the laser at a fixed focal depth at about 10 microns below the peak height of the exposed surface may be performed to achieve a desired reduction in thickness of about 25 microns or more.

In some examples, various laser parameters associated with the laser-based surface processing operations may be adjusted, changed or tuned depending on the materials and other parameters of the boule and/or the substrate. In some examples, to adjust the one or more laser parameters, data may be obtained regarding the exposed surface and/or the material of the workpiece before, during, and/or after the ablation process. The data may include, for instance, workpiece property data that provides data associated with a surface of the workpiece (e.g., topography, roughness), subsurface regions of the workpiece, optical properties of the workpiece, temperature of the workpiece, doping level of the workpiece, polytype of the workpiece (e.g., 4H, 6H), or other parameters. For instance, the workpiece property data may be obtained using one or more sensors. In some examples, the workpiece property data may include data associated with a surface topography of the workpiece. In some examples, the workpiece property data may include an image of the exposed surface obtained using an optical sensor or image capture device. In some examples, a scan of the exposed surface may be obtained using one or more surface measurement lasers or other optical devices. In some examples, an image may be captured of the exposed surface and analyzed using computer image processing techniques (e.g., classifier models, such as machine-learned classifier models) to determine data indicative of workpiece properties, such as the presence of anomalies, defects, roughness, topography, optical properties, etc.

In some embodiments, the laser parameters may be specified as a function of position on the exposed surface (e.g., the parameters are modified and changed based on position of the one or more lasers on the exposed surface). The laser parameters may be adjusted and/or selected as a function of position on the exposed surface. For instance, the laser parameters at a first position with a large surface roughness may be different from the laser parameters at a second position with a smaller surface roughness.

Aspects of the present disclosure are additionally directed to systems for implementing the methods discussed herein. For instance, aspects of the present disclosure relate to a laser processing system for processing an exposed surface of a semiconductor material. The laser processing system includes one or more laser sources configured to emit a laser configured to remove material from an exposed surface of a semiconductor structure (e.g., boule, substrate, wafer, etc.) and at least one translation stage that may impart relative motion between the at least one laser and the semiconductor structure. In some embodiments, the translation stage may move the lasers and/or the workpiece relative to one another. In some embodiments, the translation stage includes one or more optics (e.g., mirrors) along one or more axes configured to move or scan the laser relative to the semiconductor workpiece.

Additionally, in some examples, the system may include at least one sensor and a controller. The sensor(s) may be operable to obtain data associated with one or more workpiece properties. For instance, the sensor may be an optical sensor, image capture device, or one or more surface measurement lasers. The sensor(s) may be used to determine, for instance, a surface topography of at least a portion of the workpiece. The controller may receive data from the at least one sensor and determine one or more laser parameters based on the workpiece property data. The controller may control the laser to remove the exposed surface based, at least in part, on the laser parameters. As an example, the laser parameters may be specified as function of position on the exposed surface. The laser parameters may include, for instance, focusing depth, laser power, laser wavelength, laser pulse duration, laser pulse frequency, laser pulse energy, laser scan pattern, etc. In some embodiments, the controller may be additionally configured to operate the translation stage to impart relative motion between the laser and the exposed surface.

In some examples, the system may include two or more laser sources operable to emit two or more different lasers. Each laser may be configured to operate in accordance with different laser parameters (e.g., different wavelengths). For instance, in one example embodiments, a first laser source may emit a first laser to implement a coarse laser ablation process. A second laser source may emit a second laser to implement a fine laser ablation process.

In addition, and/or in the alternative, the system may include one or more laser sources operable to emit a laser to implement a laser-based removal process to remove a semiconductor wafer from a boule. The system may include one or more different laser sources (e.g., operating with different laser parameters) to implement the laser-based surface processing operations (e.g., laser ablation process(es)) on an exposed surface of a semiconductor workpiece according to example embodiments of the present disclosure. In some examples, the system may include one or more laser sources operable to scribe a fiducial workpiece mark or ID mark on the workpiece. In some examples, the system may include one or more laser sources configured to singulate or cut a plurality of semiconductor die from the workpiece. In some examples, the system 300 may include one or more laser sources configured to provide a laser-based processing operation on a workpiece edge (e.g., wafer edge).

Aspects of the present disclosure are further directed to a semiconductor wafer. The semiconductor wafer may include silicon carbide (e.g., 4H silicon carbide, 6H silicon carbide, etc.). The semiconductor wafer may include a laser-defined surface. The laser-defined surface may have a plurality of laser-defined scan features arranged in a regular pattern. The laser defined-scan features may be laser defined strips on the surface where the laser has removed material (e.g., ablated strips). The regular pattern corresponds to the scanning path of the laser during a laser-based surface processing operation. Each laser-defined scan feature (e.g., strip) may have a width w1 corresponding generally to a scan dimension associated with the laser during the laser scan. The laser-defined surface may include a surface roughness in a range of about 20 nanometers to about 65 microns. In some instances, the surface roughness may be in a range of about 0.5 nanometer to about 180 nanometers, such as about 0.5 nanometer to about 125 nanometers, such as about 1 nanometer and about 100 nanometers, such as about 2 nanometers and about 50 nanometers.

Aspects of the present disclosure provide a number of technical effects and benefits. For instance, aspects of the present disclosure allow for surface processing of semiconductor material surfaces without the use of consumable tools through non-surface contacting technologies. More specifically, aspects of the present disclosure allow for surface processing of semiconductor material surfaces using one or more lasers that are not consumed and therefore considerably reduce the manufacturing cost and time of semiconductor devices with high material strength and rigidity, such as silicon carbide. Additionally, operation costs of non-consumable surface processing operations methods do not grow in tandem with operational growth. Rather, operation costs may remain linear or stagnant due to lack of deterioration from non-surface contact. As another example, the use of non-surface contacting technologies for smoothing semiconductor material surfaces reduces the material lost due to manufacturing defects brought on during traditional surface smoothing practices. For instance, surface processing operations that use grinding may damage otherwise healthy portions of boules or substrates and create a loss of the boule or substrate entirely or otherwise may result in additional material lost to the surface processing operation to correct the damage.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, n type material has a majority equilibrium concentration of negatively charged electrons, while p type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

FIG. 1 is a first perspective view crystal plane diagram showing the coordinate system for a hexagonal crystal such as 4H-silicon carbide ("SiC"), in which the c-plane (0001) is perpendicular to both the m-plane (1$\bar{1}$00) and the a-plane (11$\bar{2}$0). The c-plane is perpendicular to the <0001> direction. The m-plane (1$\bar{1}$00) is perpendicular to the <1$\bar{1}$00> direction. The a-plane (11$\bar{2}$0) is perpendicular to the <11$\bar{2}$0> direction. The <000$\bar{1}$> direction is opposite the <0001> direction.

Figure 2:
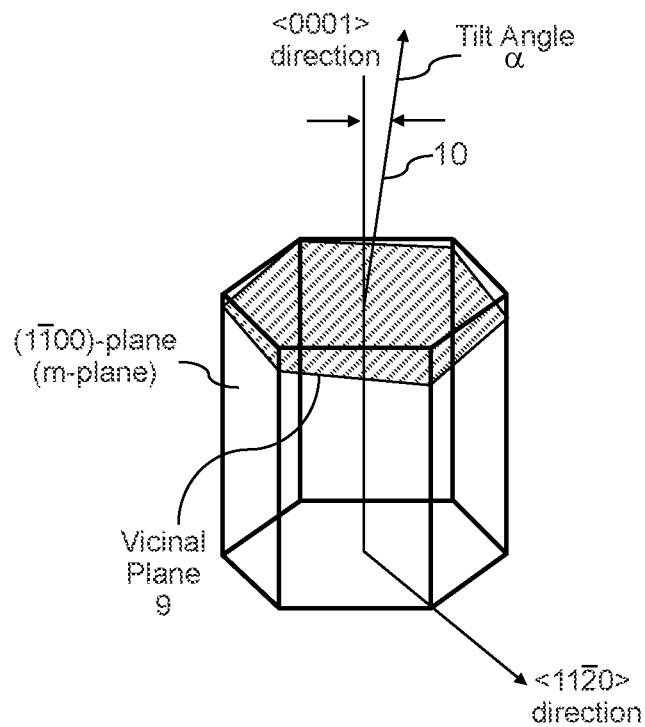
FIG. 2 is a second perspective view crystal plane diagram for a hexagonal crystal, illustrating a vicinal plane that is non-parallel to the c-plane.

FIG. 2 is a second perspective view crystal plane diagram for a hexagonal crystal, illustrating a vicinal plane 9 that is non-parallel to the c-plane, wherein a vector 10 (which is normal to the vicinal plane 9) is tilted away from the <0001> direction by a tilt angle α, with the tilt angle α being inclined (slightly) toward the <11$\bar{2}$0> direction.

Figure 3A:
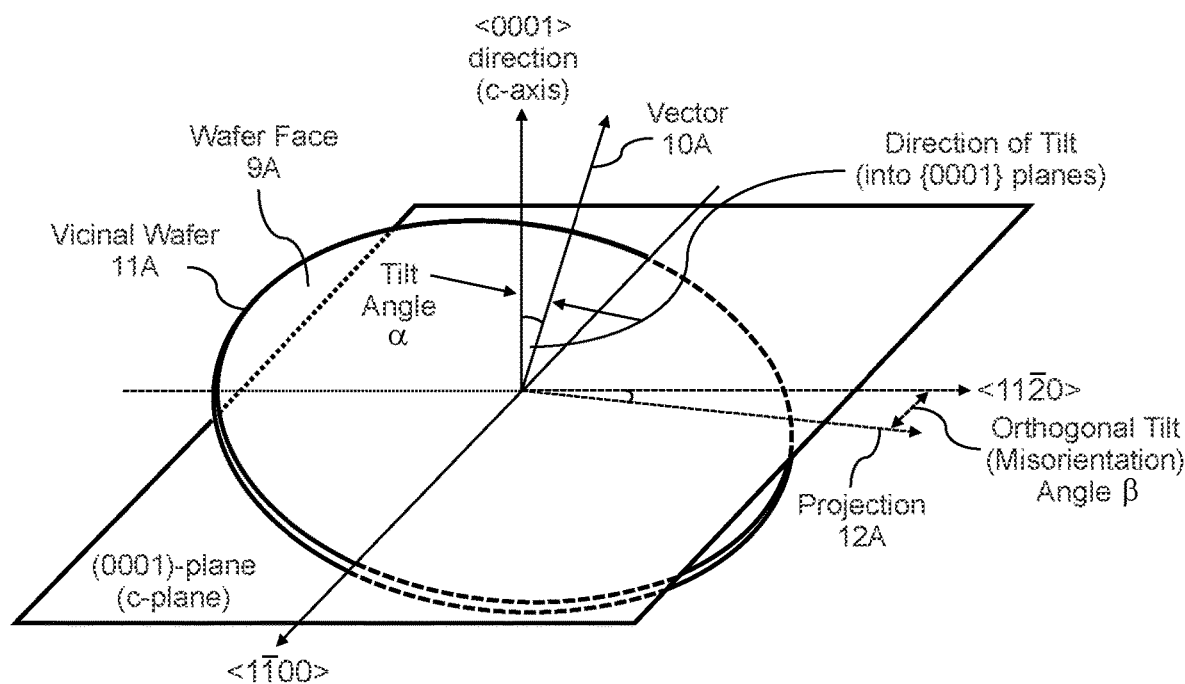
FIG. 3A is a perspective view wafer orientation diagram showing orientation of a vicinal wafer relative to the c-plane.

FIG. 3A is a perspective view of a wafer orientation diagram showing orientation of a vicinal wafer 11A relative to the c-plane (0001), in which a vector 10A (which is normal to the wafer face 9A) is tilted away from the <0001> direction by a tilt angle α. An orthogonal tilt (or misorientation angle) β may span between the <11$\bar{2}$0> direction and the projection of vector 10A onto the c-plane.

Figure 3B:
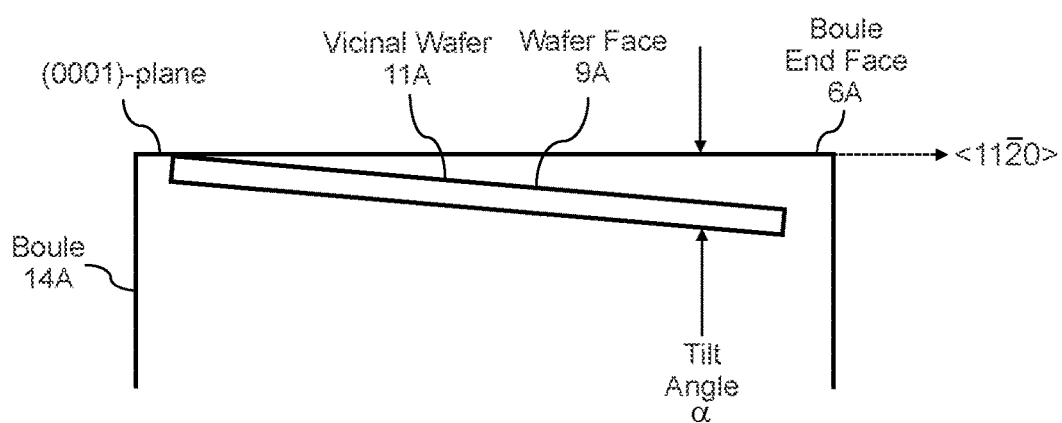
FIG. 3B is a simplified cross-sectional view of the vicinal wafer of FIG. 3A superimposed over a portion of a boule.

FIG. 3B is a simplified cross-sectional view of the vicinal wafer 11A superimposed over a portion of a boule 14A (e.g., an on-axis boule having an end face 6A parallel to the (0001) plane) from which the vicinal wafer 11A was defined. FIG. 3B shows that the wafer face 9A of the vicinal wafer 11A is misaligned relative to the (0001) plane by a tilt angle α.

Figure 3C:
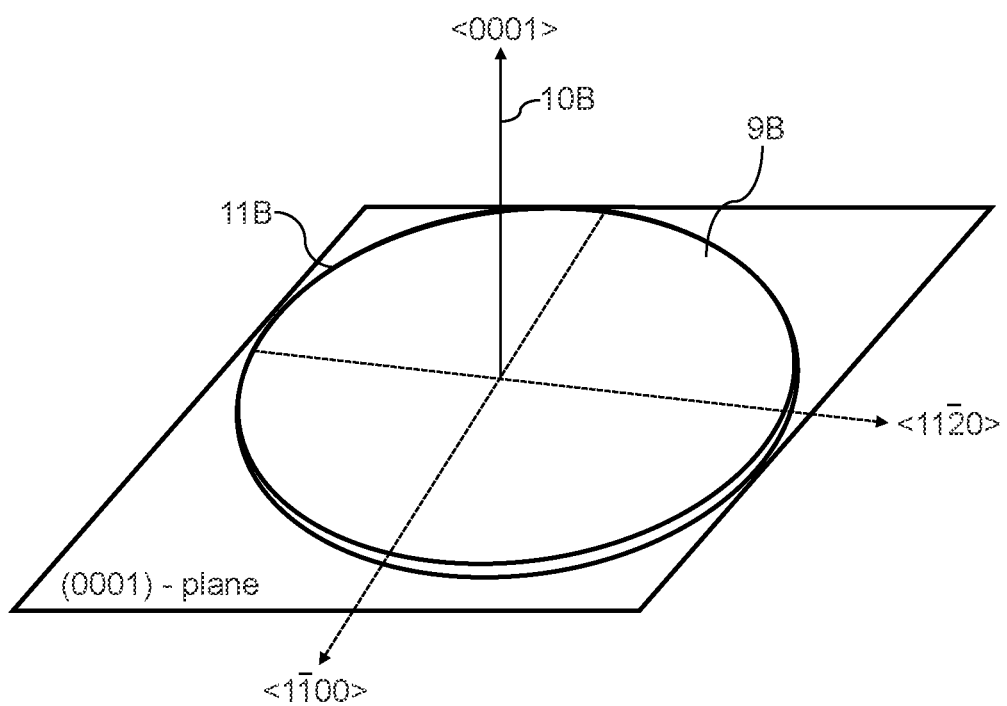
FIG. 3C is a perspective view of a wafer orientation diagram showing orientation of an on-axis wafer relative to the c-plane.
Figure 3D:
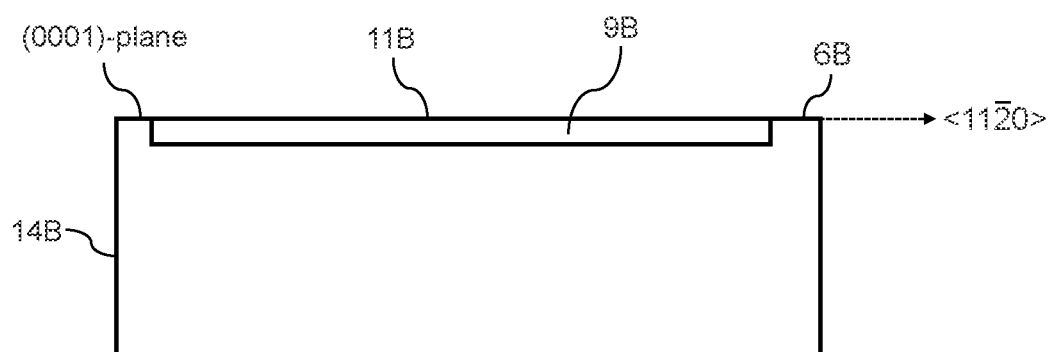
FIG. 3D is simplified cross-sectional view of the wafer of FIG. 3C superimposed over a portion of a boule.

FIG. 3C is a perspective view of wafer orientation diagram showing orientation of an on-axis wafer 11B relative to the c-plane (0001), in which a vector 10B (which is normal to the wafer face 9B) is parallel to the <0001> direction. FIG. 3D is a simplified cross-sectional view of the wafer 11B superimposed over a portion of a boule 14B (e.g., an on-axis boule having an end face 6B parallel to the (0001) plane). FIG. 3D shows that the wafer face 9B of the on axis-wafer 11B is aligned with the (0001) plane.

Figure 4:
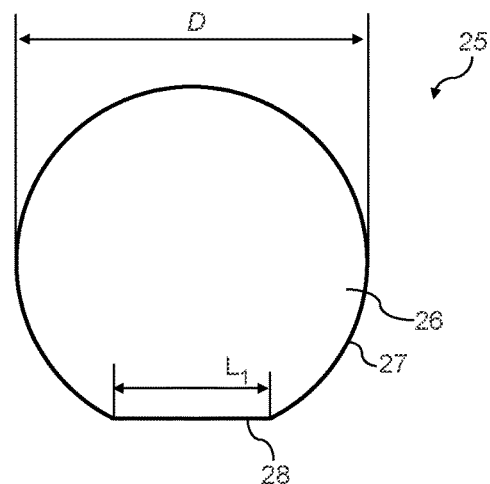
FIG. 4 is a top plan view of an exemplary silicon carbide semiconductor wafer, with superimposed arrows showing crystallographic orientation directions.

FIG. 4 is a top plan view of an example silicon carbide semiconductor wafer 25 including an upper face 26. The silicon carbide semiconductor wafer 25 may include a surface that is misaligned with (e.g., off-axis at an oblique angle relative to) the c-plane. The silicon carbide semiconductor wafer 25 may be laterally bounded by a generally round edge 27 (having a diameter D) including a primary flat 28 (having a length $L_1$) that is perpendicular, for instance, to the (11$\bar{2}$0) plane. In some instances, the wafer 25 may include a notch instead of a primary flat.

Methods disclosed herein may be applied to substrates of various crystalline materials, of both single crystal and polycrystalline varieties. In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Example materials include, but are not limited to, silicon, gallium arsenide, and diamond.

In certain embodiments, such methods may utilize single crystal semiconductor materials having a hexagonal crystal structure, such as 4H—SiC, 6H—SiC, or Group III-nitride materials (e.g., GaN, AlN, InN, InGaN, AlGaN, or AlInGaN). Various illustrative embodiments described hereinafter mention SiC generally or 4H—SiC specifically, but it is to be appreciated that any suitable crystalline material may be used. Among the various SiC polytypes, the 4H—SiC polytype is particularly attractive for power electronic devices due to its high thermal conductivity, wide bandgap, and isotropic electron mobility. Bulk silicon carbide may be grown on-axis (i.e., with no intentional angular deviation from the c-plane thereof, suitable for forming undoped or semi-insulating material) or off-axis (typically departing from a grown axis such as the c-axis by a non-zero angle, typically in a range of from 0.5 to 10 degrees (or a subrange thereof such as 2 to 6 degrees or another subrange), as may be suitable for forming n-doped or highly conductive material).

Certain embodiments herein may use substrates of doped or undoped silicon carbide, such as silicon carbide boules, which may be grown by physical vapor transport (PVT) or other conventional boule fabrication methods. If doped SiC is used, such doping may render the SiC n-type or semi-insulating in character. In certain embodiments, an n-type silicon carbide boule is intentionally doped with nitrogen. In certain embodiments, an n-type silicon carbide boule includes resistivity values within a range of 0.015 to 0.028 Ohm-centimeters. In certain embodiments, a silicon carbide boule may have resistivity values that vary with vertical position, such that different substrate portions (e.g., wafers) have different resistivity values, which may be due to variation in bulk doping levels during boule growth. In certain embodiments, a silicon carbide boule may have doping levels that vary horizontally, from a higher doping region proximate to a center of the boule to a lower doping level proximate to a lateral edge thereof.

Figure 5A:
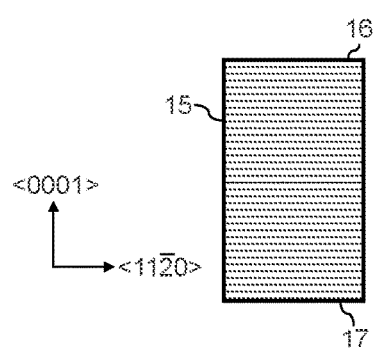
FIG. 5A is a side elevation schematic view of an on-axis boule of crystalline material.
Figure 5B:
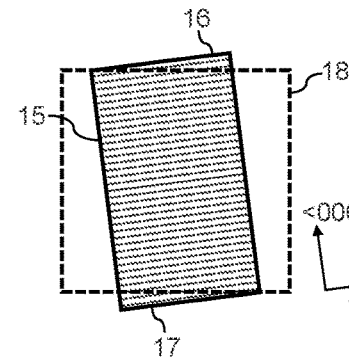
FIG. 5B is a side elevation schematic view of the boule of FIG. 5A being rotated by 4 degrees, with a superimposed pattern for cutting end portions of the boule.
Figure 5C:
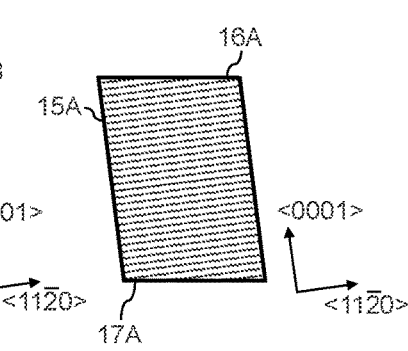
FIG. 5C is a side elevation schematic view of a boule following removal of end portions to provide end faces that are non-perpendicular to the c-direction.

FIGS. 5A and 5C schematically illustrate on-axis and off-axis crystalline substrates in the form of boules that may be utilized with methods disclosed herein. FIG. 5A is a side elevation schematic view of an on-axis boule 15 of crystalline material having first and second end faces 16, 17 that are perpendicular to the c-direction (i.e., <0001> direction for a hexagonal crystal structure material such as 4H—SiC). FIG. 5B is a side elevation schematic view of the boule 15 of FIG. 5A being rotated by four degrees, with a superimposed pattern 18 (shown in dashed lines) for cutting and removing end portions of the boule 15 proximate to the end faces 16, 17. FIG. 5C is a side elevation schematic view of an off-axis boule 15A formed from the boule 15 of FIG. 5B, following removal of end portions to provide new end faces 16A, 17A that are non-perpendicular to the c-direction. Aspects of the present disclosure are applicable to both on-axis boules 15 and/or off-axis boules 15A or other on-axis crystalline materials and/or off-axis crystalline materials.

Figure 5D:
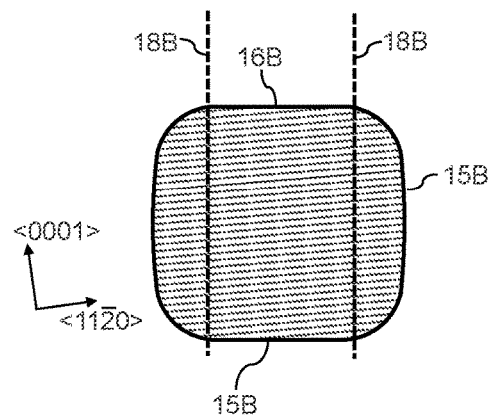
FIG. 5D is a side elevation schematic view of an off-axis grown boule of crystalline material.
Figure 5E:
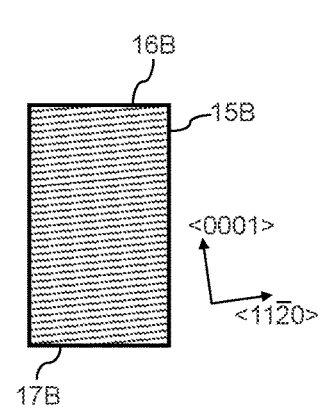
FIG. 5E is a side elevation schematic view of an off-axis grown boule having end faces that are non-perpendicular to the c-direction.

FIGS. 5D and 5E schematically illustrate off-axis grown boules that may be utilized with methods disclosed herein. FIG. 5D is a side elevation schematic view of an off-axis grown boule 15B of crystalline material (e.g., grown from an off-axis seed material) having first and second end faces 16B and 17B that are non-perpendicular to the c-direction (e.g., <0001> direction for a hexagonal crystal structure material such as 4H—SiC). Portions of the boule 15B may be cut along the superimposed pattern 18B (shown in dashed lines) to provide the off-axis boule 15B shown in FIG. 5E. Off-axis semiconductor wafers may be provided from the off-axis boule 15E by cutting or otherwise removing the wafers from the boule 15B in a manner parallel to the faces 16B, 17B.

Aspects of the present disclosure are directed to providing semiconductor wafers from any suitable boule, such as an on-axis boule, an off-axis boule, an on-axis grown boule, and off-axis grown boule, a boule grown along other directions or axes (e.g., a-axis, c-axis) or other suitable boule.

Figure 6:
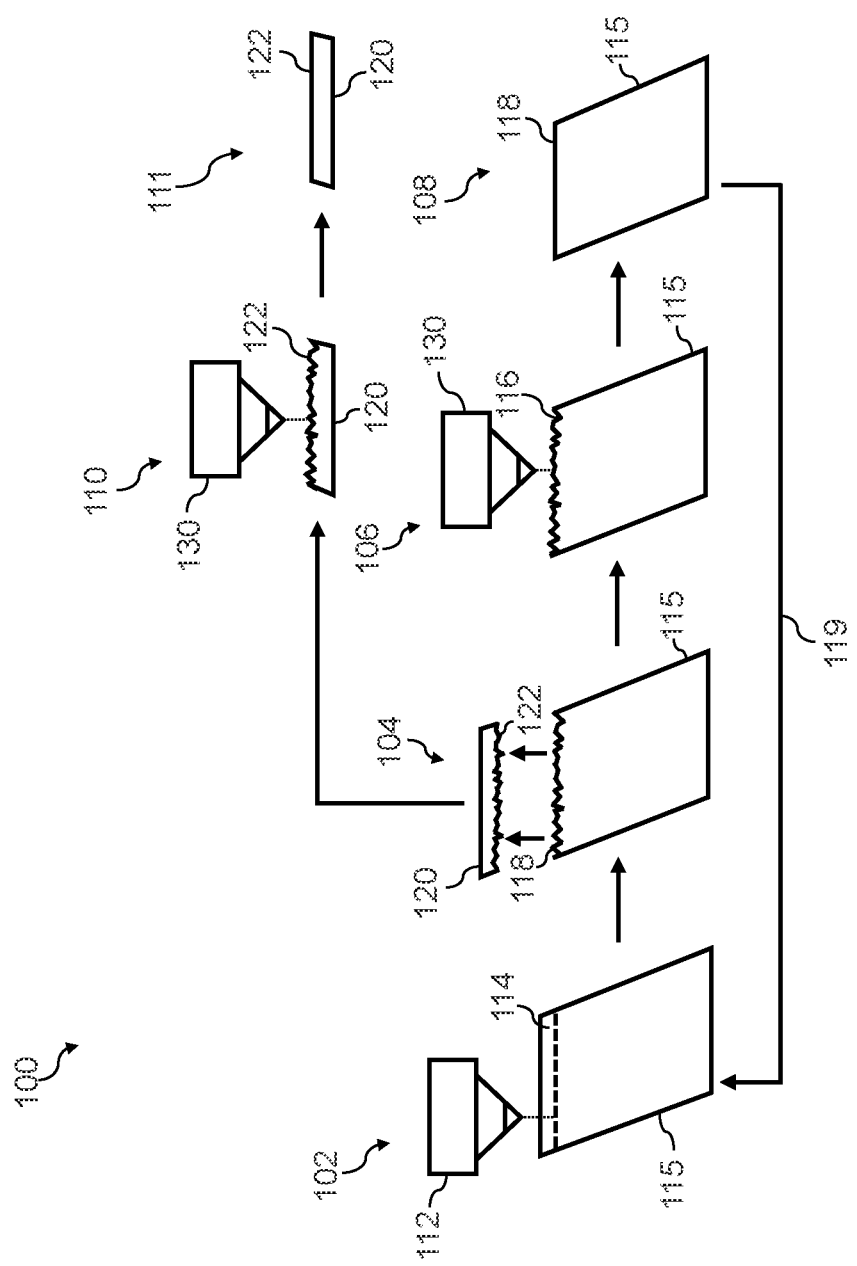
FIG. 6 depicts an overview of an example method according to examples of the present disclosure.

FIG. 6 depicts an overview of an example method 100 according to example embodiments of the present disclosure. FIG. 6 is intended to represent structures for identification and description and is not intended to represent the structures to physical scale. The method 100 depicts operations in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 102, the method 100 may include performing a removal process on a boule 115 (e.g., laser-based removal process, wire saw-based removal process). For instance, one or more laser source(s) 112 may be operated according to one or more laser parameters to induce a subsurface laser damage region 114 in the boule 115. The boule 115 may be similar to the boule 15 or the off-axis boule 15A of FIGS. 5A and 5C respectively.

In some examples, the laser source 112 may be operated in accordance with certain laser parameters to induce the subsurface laser damage region 114 in the boule 115. For instance, in certain examples, a laser having a wavelength in a range about 800 nanometers to about 1100 nanometers may be used to implement the laser-based removal process. Although a wide range of pulse frequencies may be used in certain embodiments, pulse frequencies of 120 kilohertz to 150 kilohertz may be employed in the laser-based removal process. A translation speed in a range of about 500 millimeters per second to about 3000 millimeters per second between a laser source 112 and a boule 115 may be used. However, higher or lower translation stage speeds may be used in certain embodiments with suitable adjustment of laser frequency to maintain desirable laser pulse overlap. Average laser power ranges for forming subsurface laser damage 114 may be in a range of from about 0.5 watts to about 10 watts for silicon carbide. Laser pulse energy may be calculated as power divided by frequency. Laser pulse widths of about 1 nanosecond to about 10 nanoseconds may be used, although other pulse widths may be used in other embodiments.

Referring to FIG. 6 at 104, the method 100 may include separating a semiconductor wafer 120 from the boule 115 along the subsurface laser damage region 114. Removing the wafer 120 from the boule 115 may be performed through a variety of methods. For instance, a mechanical fracturing process, ultrasonic fracturing process, or other fracturing process may be used to fracture and separate the semiconductor wafer 120 from the boule 115. FIG. 6 illustrates a laser-based removal process for purposes of illustration and discussion. Those of ordinary skill in the art, using the disclosures provided herein, will understand that other removal processes may be used without deviating from the scope of the present disclosure.

In some instances, separating the wafer 120 from the boule 115 may leave rough exposed surfaces on both the semiconductor wafer 120 and the boule 115. For instance, the semiconductor wafer 120 may have an exposed surface 122 with high surface roughness, such as a surface roughness greater than about 65 microns. Similarly, the boule 115 may have an exposed surface 118 with high surface roughness, such as a surface roughness greater than about 65 microns.

Aspects of the present disclosure are directed to using laser-based surface processing operations (e.g., laser ablation process(es)) to remove portions of the exposed surfaces and/or to provide a smoother surfaces suitable for later fabrication operations. As an example, as shown at 106, the method may include ablating the exposed surface 118 of the boule 115 using one or more lasers of a laser system 130 to remove material from the exposed surface 118. For instance, the laser system 130 may implement a coarse laser ablation process and/or a fine laser ablation process as described in further detail below. The laser ablation process(es) may result in a smoother exposed surface 118 of the boule 115 as shown at 108.

By processing the exposed surface 118 of the boule 115 with the laser system 130 as shown at 106, the boule 115 may be suitable to be reused for subsequent removal processes as indicated by arrow 119 (e.g., subsequent laser-based removal processes). More particularly, the exposed surface 118 of the boule 115 may be smoothed to allow for the formation of subsequent laser damage regions 114 in the boule 115. Otherwise, a rough surface on the boule 115 may lead to undesirable reflection/refraction of one or more laser(s) used during formation of the subsurface laser damage regions for removal of subsequent semiconductor wafers. In some examples, additional surface processing operations may occur on the boule 115 prior to subsequent removal processes (e.g., grinding, polishing, lapping, etc.).

As another example, as shown at 110, the method may include ablating the exposed surface 122 of the semiconductor wafer 120 using one or more lasers of a laser system 130 to remove material from the exposed surface 122. For instance, the laser system 130 may implement a coarse laser ablation process and/or a fine laser ablation process as described in further detail below. The laser ablation process(es) may result in a smoother exposed surface 122 of the semiconductor wafer 120 as shown at 111. Accordingly, the semiconductor wafer 120 may be suitable for subsequent semiconductor device fabrication operations.

Figure 7:
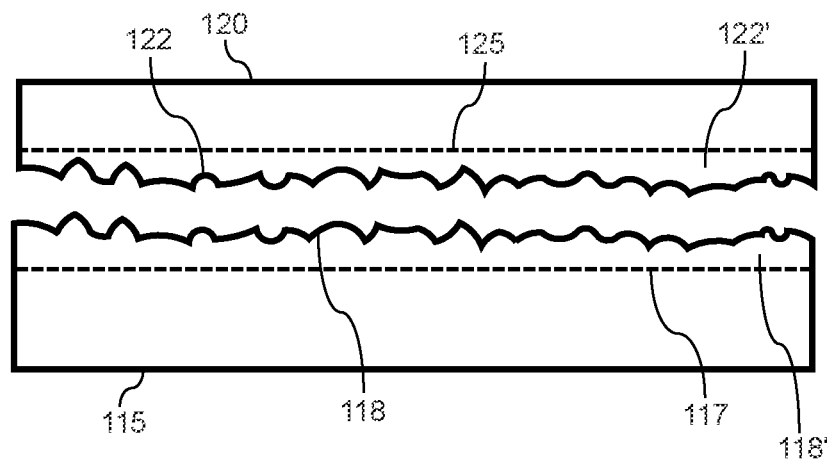
FIG. 7 depicts a cross-sectional representation of a boule that has been subjected to a removal process according to examples of the present disclosure.

FIG. 7 depicts a cross-sectional representation of the boule 115 after undergoing a removal process according to example aspects of the present disclosure. As shown, the semiconductor wafer 120 has been separated from the boule 115 leaving a rough exposed surface 118 on the boule 115 and a rough exposed surface 122 on the semiconductor wafer 120. The boule 115 may include a removal portion 118' that may be removed using laser ablation process(es) (e.g., a coarse laser ablation process and/or a fine laser ablation process) up to removal point 117 to provide a smoother surface on the portion of the boule 115. Similarly, the semiconductor wafer 120 may include a removal portion 122' that may be removed using laser ablation process(es) (e.g., a coarse laser ablation process and/or a fine laser ablation process) up to removal point 125 to provide a smoother surface on the portion of the semiconductor wafer 120.

Figure 8:
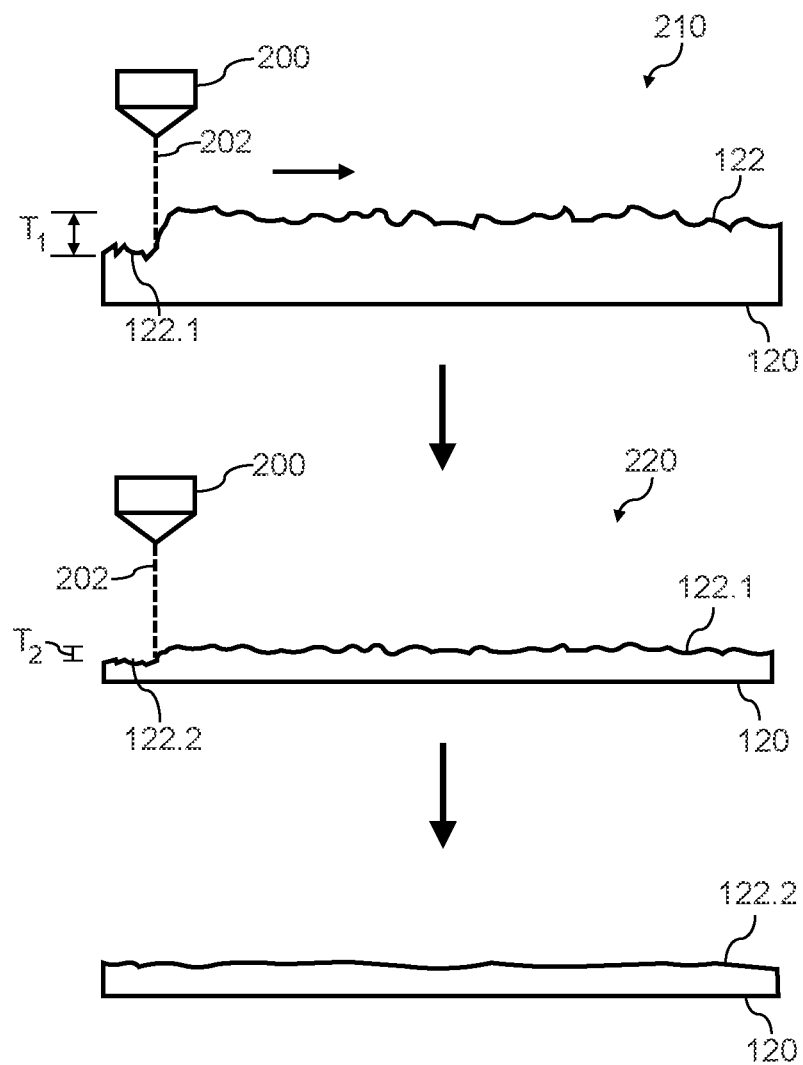
FIG. 8 depicts example laser ablation of an exposed surface according to examples of the present disclosure.

FIG. 8 depicts example laser ablation of the exposed surface 122 of the semiconductor wafer 120 using a coarse laser ablation process 210 and a fine laser ablation process 220 according to examples of the present disclosure. FIG. 8 is illustrated with respect to performing a coarse laser ablation process 210 and a fine laser ablation process 220 on the exposed surface 122 of the semiconductor wafer 120 for purposes of illustration and discussion. Those of ordinary skill in the art, using the disclosures provided herein, will understand that a coarse laser ablation process 210 and/or a fine laser ablation process 220 may be implemented on the exposed surface 118 of the boule 115 without deviating from the scope of the present disclosure.

As shown in FIG. 8, a coarse laser ablation process 210 may be implemented on the exposed surface 122 using a laser apparatus 200. The laser apparatus 200 is configured to provide emission of one or more lasers 202 onto the exposed surface. As used herein, providing emission of a laser refers to both providing continuous emission and/or providing modulated emission (e.g., a plurality of laser pulses). The laser apparatus 200 may include a laser source and one or more lenses, mirrors, or other optics to focus the laser 202 at a particular focal depth on or below the exposed surface 122. The laser apparatus 200 may emit the laser with sufficient power, pulsing frequency, and pulse duration to remove material from the exposed surface 122 (e.g., silicon carbide).

In some examples, the laser source 200 may be operated in accordance with the following laser parameters to implement the coarse laser ablation process 210:

Laser wavelength: about 500 nanometers to about 1100 nanometers, such as about 532 nanometers, such as about 1064 nanometers, such as about 1080 nanometers; or multiple wavelengths (e.g., white light) including any of the foregoing;

Laser Pulse Frequency: about 1 kilohertz to about 200 kilohertz, such as about 10 kilohertz to about 150 kilohertz, such as about 20 kilohertz to about 100 kilohertz;

Laser power: 0.1 watt to about 500 watts, such as about 0.5 watt to about 100 watts, such as about 1 watt to about 40 watts, such as about 1 watt to about 10 watts;

Laser pulse duration: about 0.1 femtoseconds to about 300 nanoseconds; such as about 1 femtosecond to about 150 nanoseconds, such as about 1 femtosecond to about 100 nanoseconds;

Translation speed: about 1 millimeter per second to about 2 meters per second, such as about 1 millimeter per second to about 1 meter per second Focusing depth: about 0 microns to about 2000 microns (beneath the surface of the workpiece), such as about 0 microns to about 1000 microns (beneath the surface of the workpiece), such as about 1 micron to about 100 microns (beneath the surface of the workpiece).

Laser Pulse Energy: about 1 nanojoule to about 2 joules, such as about 10 nanojoules to about 200 millijoules.

The coarse laser ablation process 210 may remove material from the exposed surface 122 and produce a surface 122.1 with a surface roughness between about 20 nanometers and about 65 microns, such as between about 20 nanometers and about 10 microns, such as between about 25 nanometers and 1 micron, such as between about 25 nanometers and about 150 nanometers. In addition, in some examples, a coarse laser ablation process 210 may reduce a thickness T1 of the semiconductor wafer 120 by about 5 microns to about 500 microns, such as by about 5 microns to about 100 microns, such as by about 25 microns to about 80 microns, such as by about 40 microns to about 60 microns.

In some examples, the coarse laser ablation process 210 may be performed in multiple passes of the laser at a fixed focal depth to achieve desired materials removal or thickness reduction in the exposed surface 122. For instance, multiple passes of the laser 202 at a fixed focal depth at about 1 micron below the peak height of the exposed surface 122 may be performed to achieve a desired reduction in thickness T1 of, for example, about 25 microns or more.

As shown in FIG. 8, after the coarse laser ablation process 210, a fine laser ablation process 220 may be implemented on the exposed surface 122.1 using a laser apparatus 200. The laser apparatus 200 is configured to provide emission of one or more lasers 202 onto the exposed surface. The laser apparatus 200 may include a laser source and one or more lenses, mirrors, or other optics to focus the laser at a particular focal depth on or below the exposed surface 122. The laser apparatus 200 may emit the laser with sufficient power, pulsing frequency, and pulse duration to remove material from the exposed surface 122 (e.g., silicon carbide).

In some examples, the laser apparatus 200 may be operated in accordance with the following laser parameters to implement the fine laser ablation process 220:

Laser wavelength: about 190 nanometers to about 600 nanometers, such as about 190 nanometers to about 300 nanometers, such as about 193 nanometers, such as about 200 nanometers, such as about 248 nanometers, such as about 266 nanometers, such as about 343 nanometers, such as about 355 nanometers, such as about 405 nanometers; or multiple wavelengths (e.g., white light) including any of the foregoing;

Laser Pulse Frequency: about 1 kilohertz to about 200 kilohertz, such as about 1 kilohertz to about 150 kilohertz, such as about 1 kilohertz to about 100 kilohertz, such as about 1 kilohertz to about 50 kilohertz;

Laser power: 0.1 watt to about 10 watts, such as about 0.5 watt to about 10 watts, such as about 1 watt to about 10 watts;

Laser pulse duration: about 0.1 femtoseconds to about 1 nanoseconds; such as about 1 femtosecond to about 500 picoseconds;

Translation speed: about 1 millimeter per second to about 2 meters per second, such as about 1 millimeter per second to about 1 meter per second Focusing depth: about 0 microns to about 10 microns (beneath the surface of the workpiece), such as about 0 microns to about 5 microns (beneath the surface of the workpiece), such as about 0 microns to about 1 micron (beneath the surface of the workpiece).

Laser Pulse Energy: about 1 nanojoule to about 2 joules, such as about 10 nanojoules to about 200 millijoules.

A fine laser ablation process 220 may remove material from the surface and produce a surface 122.2 with a surface roughness between about 0.5 nanometer to about 180 nanometers, such as between about 0.5 nanometers to about 125 nanometers, such as between about 1 nanometer and about 100 nanometers, such as between about 2 nanometers and about 50 nanometers. In addition, in some examples, a fine laser ablation process 220 may reduce a thickness T2 of the semiconductor wafer 120 by about 0.1 micron to about 50 microns, such as by about 1 microns to about 50 microns, such as by about 1 microns to about 25 microns, or the like.

In some examples, the fine laser ablation process 220 may be performed in multiple passes of the laser 202 at a fixed focal depth to achieve desired materials removal or thickness reduction in the exposed surface 122. For instance, multiple passes of the laser 202 at a fixed focal depth at about 1 microns below the peak height of the exposed surface 122 may be performed to achieve a desired reduction in thickness T1 of about 1 micron to 20 microns.

FIG. 8 depicts a coarse laser ablation process 210 followed by a fine laser ablation process 220 as an illustration of one example embodiment. In some embodiments, the laser ablation process may include only a coarse laser ablation process 210. In some embodiments, the laser ablation process may include only a fine laser ablation process 220.

Figure 9:
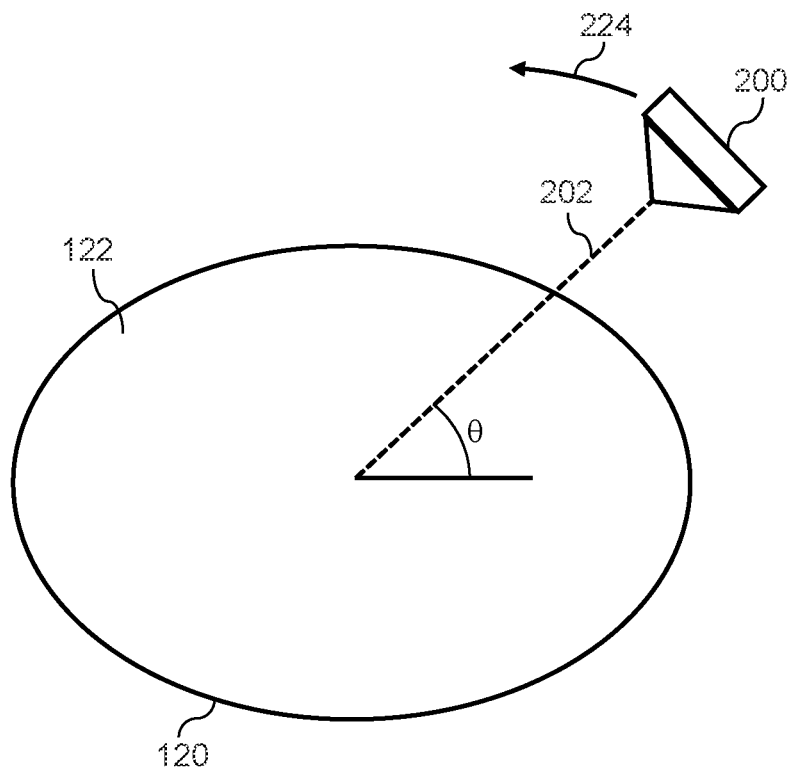
FIG. 9 depicts emission of one or more lasers at a non-perpendicular incidence angle according to examples of the present disclosure.

FIG. 8 depicts the providing emission of a laser 202 to the exposed surface 122 at a generally perpendicular incident angle relative to the exposed surface 122. However, in some embodiments, as shown in FIG. 9, the laser apparatus 200 may be configured (e.g., through one or more optics such as mirrors, lens, etc. or translation systems) to provide emission of one or more lasers 202 at a non-perpendicular incidence angle θ, such as at an incidence angle θ of less than about 75°, such as less than about 45°, such as less than about 30°, such as less than about 15°. Providing the emission of the laser 202 at a non-perpendicular incidence angle θ may help with removal of peaks in the exposed surface 122 prior to valleys in the exposed surface 122, facilitating reduction of surface roughness and planarization of the exposed surface 122 using laser ablation process(es) according to examples of the present disclosure.

In some embodiments, the incidence angle of the laser 202 relative to the exposed surface 122 may be adjusted during the laser ablation process. For instance, during a first pass of the laser 202 at a fixed focal depth (e.g., about 1 micron below the peak height of the exposed surface 122), the laser apparatus 200 may be configured to provide emission of one or more lasers at a first incidence angle (e.g., non-perpendicular incidence angle θ). During a second pass or subsequent pass of the laser 202 at a fixed focal depth (e.g., about 1 micron below the peak height of the exposed surface 122), the laser apparatus 200 may be configured to provide emission of one or more lasers 202 at a second incidence angle (e.g., non-perpendicular incidence angle θ). In some embodiments, the incidence angle of the laser 202 may be controlled as indicated by arrow 224 to be closer and closer to a perpendicular incidence angle with each subsequent pass of the laser 202 on the exposed surface 122. In some embodiments, the incidence angle θ of the laser 202 may be adjusted based at least in part on data indicative of one or more workpiece properties, such as data indicative of the surface roughness of the exposed surface 122 (e.g., obtained from one or more sensors) and/or based on data indicative of a removal depth of the exposed surface 122.

Figure 10:
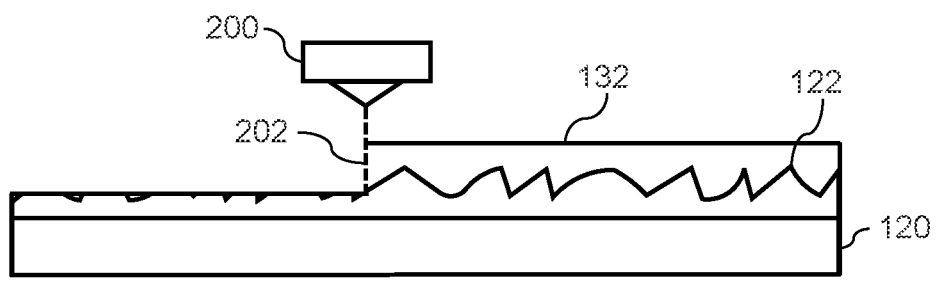
FIG. 10 depicts example laser ablation of an exposed surface with a filler material according to examples of the present disclosure.

As shown in FIG. 10, in some embodiments, a filler material 132 may be added to the surface 122 of the semiconductor wafer 120 prior to implementing the laser ablation process (e.g., coarse laser ablation 210 and/or fine laser ablation 220). The filler material 132 may fill any deep areas and cover any higher peaks to create a planarized surface on the semiconductor wafer.

The filler material 132 may have a matched removal rate to the material of the semiconductor wafer 120 (e.g., silicon carbide) for a laser ablation process. For instance, the removal rate associated with the semiconductor workpiece may be within 20% of the removal rate associated with the filler material.

The filler material 132 may facilitate creating a planar surface with low surface roughness as a result of the laser ablation process. For instance, by using the filler material 132 to create a planar surface on the exposed surface 122 of the semiconductor wafer 120, the resulting surface 122.1, as a result of the laser ablation process, will have a lower surface roughness.

In some examples, the filler material 132 may be a sol-gel defined liquid. In some examples, the filler material 132 may be a spin-coatable glass. In some examples, the filler material 132 may be a ceramic composite. In some examples, the filler material 132 may be or include organosilicone, such as tetraethyl orthosilicate (TEOS), tetramethylcyclotetra-siloxane (TMCTS), polydimethylsiloxane (PDMS), cyclic siloxanes, or related compounds. In some examples, the filler material 132 may be a hydrate with a metal oxide precursor (e.g., $ZnO \times H_2O$) or nitrate precursor (e.g., $Ga(NO_3)_3 \times H_2O$). While example filler materials 132 have been discussed herein, it should be appreciated that any sol gel processes that creates liquid processable materials with properties required for a selected surface removal process may be used as a filler material 132 according to the present disclosure.

In some examples, the filler material 132 may be a non-sol gel material that may fill the substrate surface topography. For instance, the filler material 132 may be a curable liquid composite that may be engineered to fill voids, adhere to surfaces, and be curable into a hard solid through a curing process via exposure to radiation (e.g., visible light or UV light). In some examples, the filler material 132 may be cured through any suitable curing processes, such as photo-curing, thermal curing, chemical curing, microwave curing, pressure curing, ambient curing, electromagnetic radiation curing, electrochemical curing, or other suitable curing processes.

As an example, the filler material 132 may be a photo-curable resin-based composite (PCRB). Suitable PCRB's may be a mixture of photopolymerizable monomers, photoactive polymerization initiators, and a surface functionalized filler (SFF).

In some examples, the PCRB may include a resin binder with a mixture of two methacrylate terminated monomers that may include, for instance, a base monomer and diluent monomer. Example base monomers may include, for instance, bisphenol A glycol dimethacrylate (Bis-GMA), ethoxylated bisphenol A glycol dimethacrylate (Bis-EMA), or urethane dimethacrylate (UDMA). Example dilutant monomers may include, for instance, triethylene glycol dimethacrylate (TEDGMA), decanediol dimethacrylate (D3MA), or 2-hydroxyethyl methacrylate (HEMA). Filler materials that include a PCRB with a resin binder may be curable using a free radical initiator. Example free radical initiators may include a camphorquinone mixed with an amine photo-polymerization accelerator such as ethyl 4-(dimethylamino) benzoate, N,N-dimethylaminoethyl methacrylate, 2-ethyl-dimethylbenzoate, N,N-dimethyl-p-toluidine, or N-phenylglycine.

In some examples, the SFF in the PCRB may include microparticles or nanoparticles of, for instance, ceramics, inorganic compounds, metals, metalloids, minerals, non-metallic elements, inorganic-inorganic hybrid materials, inorganic-inorganic composites, organic compounds, organic-inorganic hybrid materials, organic-inorganic composites, or similar materials. The SFFs may include microparticles or nano-particles with matched properties to a semiconductor wafer material and surface removal process. In some example SFFs, compounds may be used to functionalize the surface of the particles, promote dispersion and couple to the resin matrix during curing of a PCRB. In some examples, these compounds may include 10-methacryloyloxydecyl dihydrogen phosphate, dipentaerythritol penta-acrylate phosphate, thiourethane oligomers, or similar materials.

Figure 11:
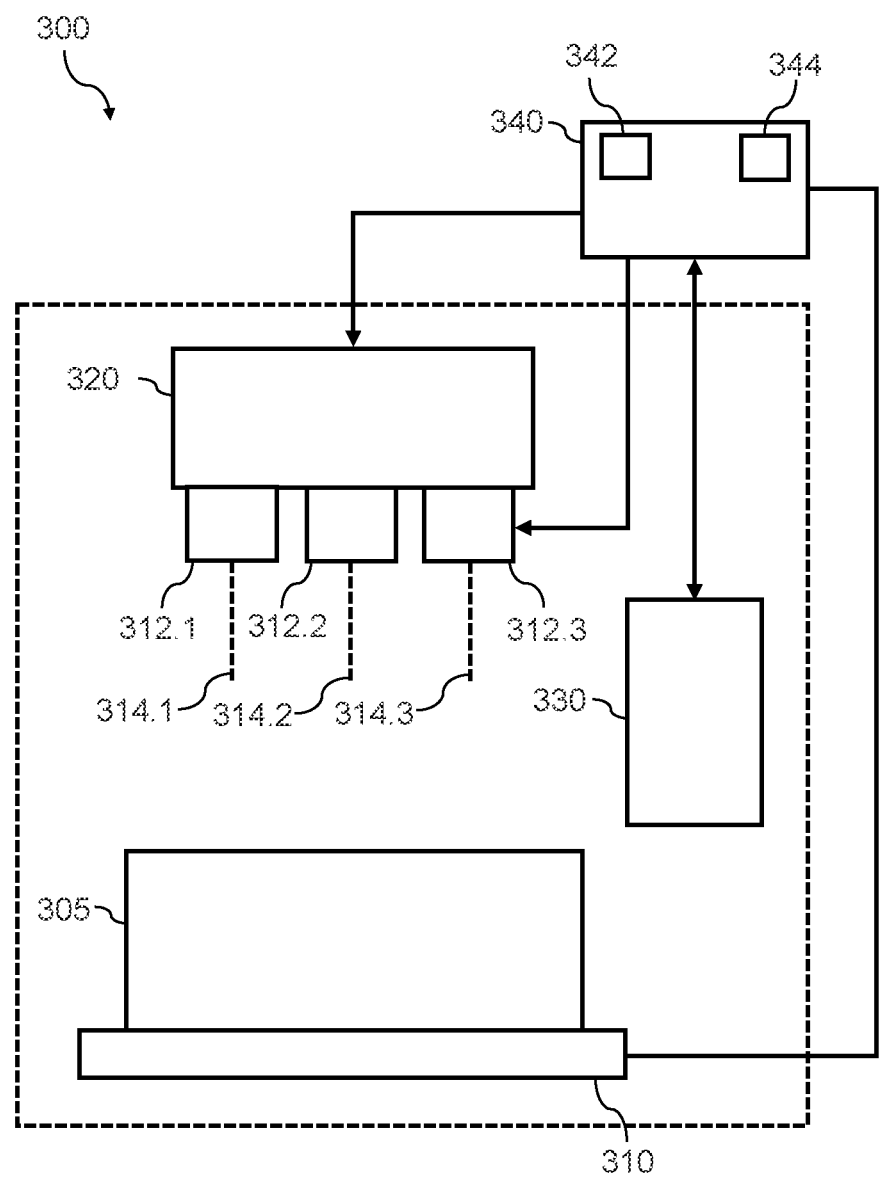
FIG. 11 depicts an example laser processing system according to examples of the present disclosure.

FIG. 11 depicts an example laser processing system 300 according to examples of the present disclosure. The laser processing system 300 may be configured to implement one or more aspects of the present disclosure, such as the laser-based removal processes and/or laser-based surface processing operations (e.g. coarse laser ablation processes and/or fine laser ablation processes) disclosed herein.

The laser processing system 300 includes one or more laser sources 312.1, 312.2, 312.3, . . . , 312.*n*. The one or more laser sources 312.1, 312.2, 312.3, . . . , 312.*n* may each be configured to respectively emit a laser 314.1, 314.2, 314.3, . . . , 314.*n* in accordance with various laser parameters. The laser parameters may include, for instance, focusing depth, laser power, laser wavelength, laser pulse duration, laser pulse frequency, laser pulse energy, etc.

The laser sources 312.1, 312.2, 312.3, . . . , 312.*n* may each be associated with one or more wavelengths and may be, for instance, one or more of an excimer laser, UV laser, visible light laser, infrared laser, single wavelength laser, multiwavelength laser, white laser, etc. The laser sources 312.1, 312.2, 312.3, . . . , 312.*n* may each be associated with a pulse duration and may be, one or more of an attosecond laser, femtosecond laser, nanosecond laser, etc. The laser sources 312.1, 312.2, 312.3, . . . , 312.*n* may each be associated with a lasing medium and may be, for instance, a gas (e.g., $CO_2$) laser, solid state laser (e.g., GaN, AlGaN, YAG, etc.), diode laser, fiber laser, etc. The laser sources 312.1, 312.2, 312.3, . . . , 312.*n* may be one or more of a single frequency laser, frequency doubled laser, frequency tripled laser, frequency quadrupled laser, etc.

The laser sources 312.1, 312.2, 312.3, . . . , 312.*n* may each be the same type of laser source or different types of laser sources. The laser sources 312.1, 312.2, 312.3, . . . , 312.*n* may be configured to emit lasers 314.1, 314.2, 314.3, . . . , 314.*n* in accordance with the same laser parameters or different laser parameters.

For instance, in some embodiments, the laser processing system 300 may include a first laser source 312.1, a second laser source 312.2, and a third laser source 312.3. The first laser source 312.1 may be operable to emit a laser 314.1 with laser parameters sufficient to perform a laser-based removal process, such as the laser-based removal process shown at 102 of FIG. 6. The second laser source 312.2 may be operable to emit a laser 314.2 with laser parameters sufficient to perform a coarse laser ablation process. In some embodiments, the second laser source 312.2 may be an infrared laser source configured to emit an infrared laser. In some embodiments, the second laser source 312.2 may be configured to emit a laser 314.2 in accordance with the following coarse laser parameters:

Laser wavelength: about 500 nanometers to about 1100 nanometers, such as about 532 nanometers, such as about 1064 nanometers, such as about 1080 nanometers; or multiple wavelengths (e.g., white light) including any of the foregoing;

Laser pulse frequency: about 1 kilohertz to about 200 kilohertz, such as about 10 kilohertz to about 150 kilohertz, such as about 20 kilohertz to about 100 kilohertz;

Laser power: 0.1 watt to about 500 watts, such as about 0.5 watt to about 100 watts, such as about 1 watt to about 40 watts, such as about 1 watt to about 10 watts;

Laser pulse duration: about 0.1 femtoseconds to about 300 nanoseconds; such as about 1 femtosecond to about 150 nanoseconds, such as about 1 femtosecond to about 100 nanoseconds;

Translation speed: about 1 millimeter per second to about 2 meters per second, such as about 1 millimeter per second to about 1 meter per second Focusing depth: about 0 microns to about 2000 microns (beneath the surface of the workpiece), such as about 0 microns to about 1000 microns (beneath the surface of the workpiece), such as about 1 micron to about 100 microns (beneath the surface of the workpiece).

Laser Pulse Energy: about 1 nanojoule to about 2 joules, such as about 10 nanojoules to about 200 millijoules.

The third laser source 312.3 may be configured to emit a laser 314.3 with laser parameters sufficient to perform a fine laser ablation process. In some embodiments, the third laser source 312.3 may be an ultraviolet laser source configured to emit an ultraviolet laser. In some embodiments, the third laser source 312.3 may be configured to emit a laser 314.3 in accordance with the following fine laser parameters:

Laser wavelength: about 190 nanometers to about 600 nanometers, such as about 190 nanometers to about 300 nanometers, such as about 193 nanometers, such as about 200 nanometers, such as about 248 nanometers, such as about 266 nanometers, such as about 343 nanometers, such as about 355 nanometers, such as about 405 nanometers; or multiple wavelengths (e.g., white light) including any of the foregoing;

Laser pulse frequency: about 1 kilohertz to about 200 kilohertz, such as about 1 kilohertz to about 150 kilohertz, such as about 1 kilohertz to about 100 kilohertz, such as about 1 kilohertz to about 50 kilohertz;

Laser power: 0.1 watt to about 10 watts, such as about 0.5 watt to about 10 watts, such as about 1 watt to about 10 watts;

Laser pulse duration: about 0.1 femtoseconds to about 1 nanoseconds; such as about 1 femtosecond to about 500 picoseconds;

Translation speed: about 1 millimeter per second to about 2 meters per second, such as about 1 millimeter per second to about 1 meter per second Focusing depth: about 0 microns to about 10 microns (beneath the surface of the workpiece), such as about 0 microns to about 5 microns (beneath the surface of the workpiece), such as about 0 microns to about 1 micron (beneath the surface of the workpiece);

Laser Pulse Energy: about 1 nanojoule to about 2 joules, such as about 10 nanojoules to about 200 millijoules.

FIG. 11 depicts three laser sources 312.1, 312.2, 312.3 for purposes of illustration and discussion. Those of ordinary skill in the art, using the disclosures provided herein, will understand that the system 300 may include more or fewer laser sources without deviating from the scope of the present disclosure. For instance, the system 300 may include a plurality of first laser sources 312.1 operable to emit a laser 314.1 with laser parameters sufficient to perform a laser-based removal process. The system 300 may include a plurality of second laser sources 312.2 operable to emit a laser 314.2 with laser parameters sufficient to perform a coarse laser ablation process (e.g., as discussed with reference to FIG. 23). The system 300 may include a plurality of third laser sources 312.3 operable to emit a laser 314.3 with laser parameters sufficient to perform a fine laser ablation process (e.g., as discussed with reference to FIG. 23).

The system 300 may include one or more additional laser sources to provide different functionality. In some examples, the system 300 may include one or more laser sources operable to scribe a fiducial workpiece mark or ID mark on the workpiece. In some examples, the system 300 may include one or more laser sources configured to singulate or cut a plurality of semiconductor die from the workpiece. In some examples, the system 300 may include one or more laser source configured to obtain metrology (e.g., surface topography measurements) of a workpiece 305.

The system 300 includes a workpiece support 310 configured to support a semiconductor workpiece 305 (e.g. boule 115 and/or semiconductor wafer 120). The workpiece support 310 may include a chuck (e.g., vacuum chuck) or other mechanism to hold the workpiece 305 in place during laser processing according to examples of the present disclosure.

The one or more laser sources 312.1, 312.2, 312.3, . . . , 312.*n* may be coupled to a translation stage 320 that may move the one or more laser sources 312.1, 312.2, 312.3, . . . , 312.*n* relative to the workpiece. In addition, the laser sources 312.1, 312.2, 312.3, . . . , 312.*n* and/or translation stage 320 may include one or more optics (e.g., lens, mirrors, etc.) to facilitate moving the laser 314.1, 314.2, 314.3, . . . , 314.*n* from the laser sources relative to the workpiece 305. In addition, or in the alternative, the workpiece support 310 may be operable to move the workpiece 305 relative to the one or more laser sources 312.1, 312.2, 312.3, . . . , 312.*n*. In this way, the system 300 may be able to control the translation stage 320 and/or the workpiece support 310 to impart relative motion between the lasers 314.1, 314.2, 314.3, . . . , 314.*n* and the workpiece 305 to implement laser-based removal processes and/or laser ablation processes according to examples of the present disclosure. In some examples, the translation stage 320 and/or the workpiece support 310 may be controlled to impart relative motion between the lasers 314.1, 314.2, 314.3, . . . , 314.*n* and the workpiece 305 to scan at least 85% of the exposed surface through relative motion between the one or more lasers and the exposed surface, such as at least 95% of the exposed surface, such as at least 99% of the exposed surface to implement laser processing according to examples of the present disclosure. However, in some examples, the lasers 314.1, 314.2, 314.3, . . . , 314.*n* may scan less of the surface, such as less than about 50% of the surface. For instance, in examples, involving patterning of the surface of a workpiece (e.g., with areas of sub-surface damage) for fiducial marking, dicing, etc., the lasers 314.1, 314.2, 314.3, . . . , 314.*n* may scan 50% or less of the surface.

In some embodiments, the laser processing system 300 may additionally include one or more sensors 330 for obtaining data associated with the workpiece 305, such as workpiece property data for the workpiece 305. The workpiece property data may include, for instance, data associated with a surface of the workpiece 305 (e.g., topography, roughness), subsurface regions of the workpiece 305, optical properties of the workpiece 305, temperature of the workpiece 305, doping level of the workpiece 305, polytype of the workpiece 305 (e.g., 4H, 6H), or other parameters.

In some embodiments, the one or more sensors 330 may include, for instance, an optical sensor, such as an image capture device (e.g., camera) that may capture images at one or more wavelengths of visible light and/or ultraviolet or infrared light. In some embodiments, the one or more sensors 330 may include one or more surface measurement lasers that may be operable to emit a laser onto the surface of the workpiece 305 and scan the surface (based on reflections of the laser) for depth measurements, topography measurements, etc. of the surface of the workpiece 305. Other suitable sensors 330 may be used without deviating from the scope of the present disclosure.

The laser processing system 300 includes one or more control devices, such as a controller 340. The controller 340 may include one or more processors 342 and one or more memory devices 344. The one or more memory devices 344 may store computer-readable instructions that when executed by the one or more processors 342 cause the one or more processors 342 to perform one or more control functions, such as any of the functions described herein. The controller 340 may be in communication with various other aspects of the laser processing system 300 through one or more wired and/or wireless control links. The controller 340 may send control signals to the various components of the laser processing system 300 (e.g., the laser sources 312.1, 312.2, 312.3, . . . , 312.n, the workpiece support 310, the sensor 330) to implement a laser processing operation on the workpiece 305.

In some embodiments, the controller 340 may control aspects of the laser processing system 300 (e.g., the laser sources 312.1, 312.2, 312.3, . . . , 312.n) based at least in part on data from the sensor(s) 330. For instance, the controller 340 may adjust various laser parameters for lasers 314.1, 314.2, 314.3, . . . , 314.n emitted by the laser sources 312.1, 312.2, 312.3, . . . , 312.n based at least in part on data from the sensor(s) 330. The laser parameters may include, for instance, one or more of focusing depth, laser power, laser wavelength, laser pulse duration, laser pulse frequency, laser pulse energy, scan pattern, and/or translation speed. In some embodiments, the laser parameters may include incidence angle of the lasers 314.1, 314.2, 314.3, . . . , 314.n on the workpiece 305. The controller 340 may be configured to adjust the laser parameters based on sensor data associated with a current workpiece 305 undergoing a laser-based surface processing operation (e.g., dynamic adjustment during or after a laser-based surface processing operation) or based on sensor data associated with past semiconductor workpieces that had previously undergone a laser-based surface processing operation. In some embodiments, the laser sources 312.1, 312.2, 312.3 . . . , 312.n may include an adaptive optics system that may include one or more lenses, mirrors, or other optical devices. The lenses, mirrors, or other optical devices may be moved or adjusted to adjust one or more of the one or more laser parameters. For instance, the one or more lenses may be swapped or adjusted to change a focal depth of the lasers 314.1, 314.2, 314.3 . . . , 314.n.

Figure 12:
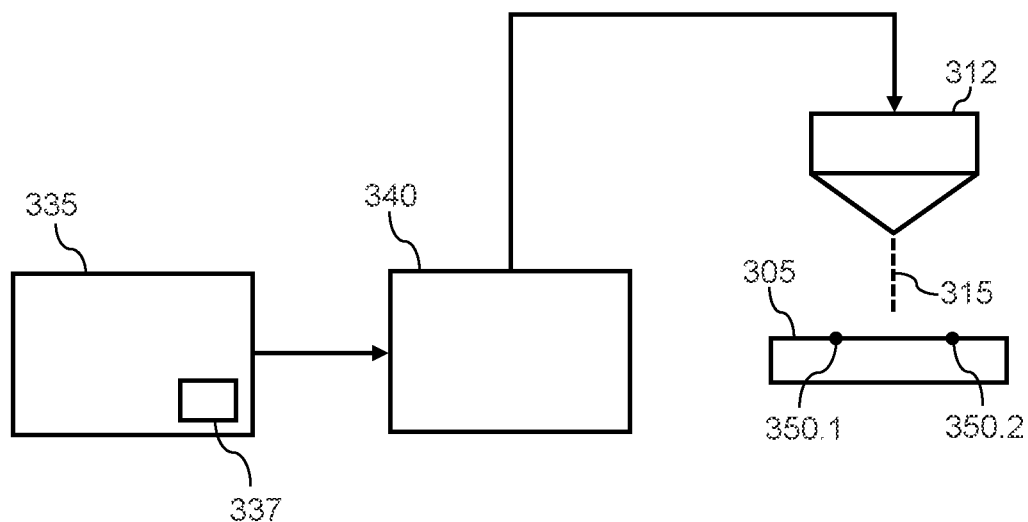
FIG. 12 depicts example control of a laser based on sensor data according to examples of the present disclosure.

FIG. 12 depicts an overview of example control of a laser source 312 based at least in part on sensor data 335 from the one or more sensors 330 or other data (e.g., from metrology tools) according to examples of the present disclosure. As shown, the sensor data 335 may be provided to the controller 340 (e.g., through a communication link). The sensor data 335 may include, for instance, workpiece property data 337. Workpiece property data 337 may include data associated with a surface of the workpiece 305 (e.g., topography, roughness), subsurface regions of the workpiece 305, optical properties of the workpiece 305, temperature of the workpiece 305, doping level of the workpiece 305, polytype of the workpiece 305 (e.g., 4H, 6H), or other parameters. In some examples, the workpiece property data 337 may include data associated with a surface topography of the workpiece. In some examples, the workpiece property data 337 may include an image of the exposed surface obtained using an optical sensor or image capture device. In some examples, a scan of the exposed surface may be obtained using one or more surface measurement lasers or other optical devices. In some examples, an image may be captured of the exposed surface and analyzed using computer image processing techniques (e.g., classifier models, such as machine-learned classifier models) to determine data indicative of workpiece properties, such as the presence of anomalies, defects, roughness, topography, optical properties, etc. The controller 340 may determine one or more laser parameters for the laser 315 emitted by the laser source 312 on the workpiece 305 based on the sensor data 335 or other data. For instance, in some embodiments, the controller 340 may access a model, algorithm, function, lookup table, machine-learned model, etc., that correlates one or more laser parameters based on the data and/or position on the workpiece 305.

In some embodiments, the one or more laser parameters are specified as a function of both a position on the workpiece 305 and sensor data 335 or other data associated with that specific position. For instance, the controller 340 may determine a first set of laser parameters for the laser 315 for ablating or removing material at a first position 350.1 on the workpiece 305. The controller 340 may determine a second set of laser parameters for the laser 315 for ablating or removing material at a second position 350.2 on the workpiece 305. The first set of laser parameters may be different from or the same as the second set of laser parameters.

In this way, the laser parameters may be continuously or periodically adjusted or tuned to perform ablation and/or materials removal based on one or more workpiece properties at a specific position on the workpiece 305. In some embodiments, this may provide, for instance, higher laser power for a first position 350.1 on the workpiece 305 relative to a second position 350.2 on the workpiece 305. In some embodiments, this may provide, for instance, a first incidence angle of the laser 315 relative to the workpiece 305 at a first position 350.1 on the workpiece 305 and a second incidence angle of the laser 315 relative to the workpiece 305 at a second position 350.2 on the workpiece 305. In some embodiments, this may provide, for instance, use of a first laser source 312 operable to emit a laser 315 associated with a first wavelength (e.g., infrared wavelength) at a first position 350.1 on the workpiece and use of a second laser source 312 operable to emit a laser 315 associated with a second wavelength (e.g., ultraviolet wavelength) at a second position 350.2 on the workpiece. A variety of laser parameters (e.g., focusing depth, laser power, laser wavelength, laser pulse duration, laser pulse frequency, translation speed, incidence angle, laser pulse energy) may be adjusted as a function of position on the workpiece and/or sensor data or other data without deviating from the scope of the present disclosure.

In some examples, the laser source 312 may be dynamically adjusted, or tuned, during a laser-based surface processing operation. For instance, the one or more sensors 330 or other data sources may provide sensor data 335 or other data to the controller 340 and the controller 340 may determine, or adjust, one or more laser parameters for the laser 315 based on the data while performing the laser-based surface processing operation. For instance, the one or more sensors 330 may provide data indicative of a surface topography of the workpiece 305 to the controller 340 while the laser 315 is processing the surface of the workpiece 305. The controller 340 may then adjust one or more laser parameters of the laser 315 based on the data while the laser 315 is still processing the surface of the workpiece 305. In this way, the one or more laser parameters may be dynamically adjusted, or tuned, during laser surface processing operations.

In some examples, the one or more laser parameters of the laser source 312 may be adaptively tuned, or adjusted, through multiple laser-based surface processing operations. For instance, data regarding the workpiece 305 (e.g., workpiece property data) may be collected before, during, and/or after a laser-based surface processing operation. The controller 340 may then tune or adjust one or more laser parameters of the laser source 312 based on the data. For instance, the laser source 312 may include a set of one or more laser parameters for a laser-based surface processing operation. The laser source 312 may perform a laser-based surface processing operation on the surface of a workpiece 305 and the one or more sensors 330 may obtain workpiece property data after the operation. The workpiece property data may then be provided to the controller 340 which may adjust, or tune, one or more of the set laser parameters associated with the laser source 312 and reprocess the surface of the workpiece 305.

In some examples, the one or more laser parameters may be adaptively tuned for future laser-based surface processing operations and/or future additional workpiece(s) 305. For instance, the controller 340 may determine one or more laser parameter adjustments based on one or more laser-based surface processing operations on a first workpiece 305 and apply the adjustments to one or more laser parameters for a laser-based surface processing operation on a second workpiece 305.

Figure 13:
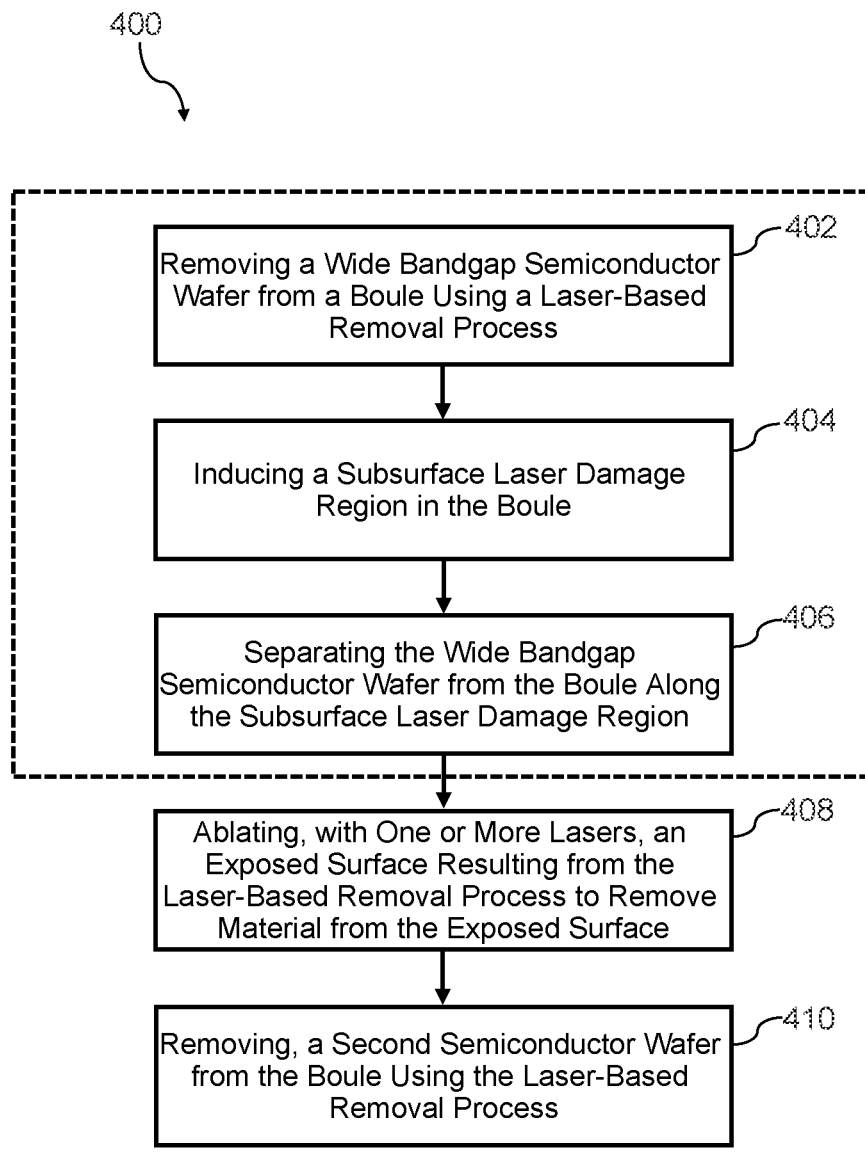
FIG. 13 depicts a flow chart diagram of an example method according to examples of the present disclosure.

FIG. 13 depicts a flow chart diagram of an example method 400 according to example aspects of the present disclosure. The method 400 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 402, the method 400 includes removing a wide bandgap semiconductor wafer from a boule using a removal process. In some embodiments, the boule may be a silicon carbide boule and, therefore, the wide bandgap semiconductor wafer may be a silicon carbide semiconductor wafer.

As shown in FIG. 13, the removal process may include, for example, at 404, inducing a subsurface laser damage region in the boule. In some instances, the subsurface laser damage may be induced in the boule using one or more lasers. The removal process may additionally include, for example, at 406 separating the wide bandgap semiconductor wafer from the boule along the subsurface laser damage region. A variety of separation methods may be used to separate the wide bandgap semiconductor wafer from the boule.

At 408, the method 400 includes ablating, with one or more lasers, an exposed surface resulting from the removal process to remove material from the exposed surface. The exposed surface may be a surface of the wide bandgap semiconductor wafer or a surface of the boule.

In some embodiments, ablating the exposed surface may include a coarse laser ablation process performed with one or more lasers. The coarse laser ablation process may remove material from the exposed surface such that the exposed surface has a surface roughness in a range of about 20 nanometers to about 65 microns.

In some embodiments, ablating the exposed surface may include implementing a fine laser ablation process after the coarse ablation process. The fine laser ablation process may remove material from the exposed surface such that the exposed surface has a surface roughness in a range of about 0.5 nanometer to about 180 nanometers.

In some embodiments, the coarse laser ablation process may be implemented using a first laser and the fine laser ablation process may be implemented using a second laser. The first laser and the second laser may have different laser parameters. For instance, the first laser may include a longer wavelength relative to the second laser. As an example, the first laser may be an infrared laser and the second laser may be an ultraviolet laser.

At 410, the method 400 includes removing a second semiconductor wafer from the boule using the removal process. For instance, after ablating the surface of the boule with one or more lasers according to examples of the present disclosure, the boule may be reused to create a second wide bandgap semiconductor wafer through the methods disclosed herein.

Figure 14:
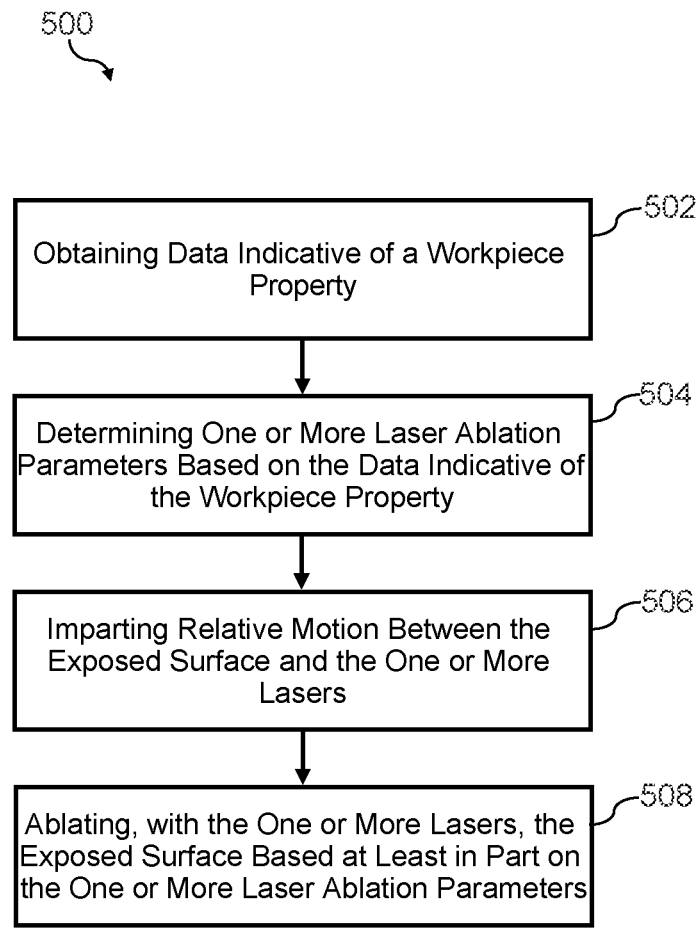
FIG. 14 depicts a flow chart diagram of an example method according to examples of the present disclosure.

FIG. 14 depicts a flow chart diagram of an example method 500 according to aspects of the present disclosure. The method 500 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure. The method 500 may be implemented, for example, as part of the laser ablation process described at 408 in the method 400 of FIG. 13.

At 502, the method 500 includes obtaining workpiece property data associated with the workpiece. For instance, the workpiece property data may be obtained from one or more sensors. In some embodiments, the workpiece property data may be obtained by scanning the exposed surface with one or more surface measurement lasers. In some embodiments, the workpiece property data may be obtained from an optical sensor or image capturing device (e.g., camera) and processing or analyzing the images (e.g., using digital image process techniques) obtained from the optical sensor or image capturing device. The workpiece property data may be obtained in a variety of formats without deviating from the scope of the present disclosure.

At 504, the method 500 includes determining one or more laser parameters based on the workpiece property data. For instance, the method may include determining one or more of laser power, laser wavelength, laser pulse frequency, laser pulse duration, focusing depth, lase pulse energy, translation speed, laser scan pattern, or laser incidence angle based on the workpiece property data. In some embodiments, the one or more laser parameters may be determined as a function of position on the exposed surface.

At 506, the method 500 includes imparting relative motion between the exposed surface and the one or more lasers. In some instances, imparting relative motion may be performed during other operations of the method 500. For example, imparting relative motion between the exposed surface and the one or more lasers may be performed during the operation 508 described below. As an example, imparting relative motion between the one or more lasers and the exposed surface may result in at least 85% of the exposed surface, such as at least 95% of the exposed surface, such as at least 99% of the exposed surface being scanned by the one or more lasers. In some instances, imparting relative motion between the exposed surface and the one or more lasers may include moving the exposed surface relative to the one or more lasers. The inverse may also be true. In some instances, the one or more lasers may be moved relative to the exposed surface.

At 508, the method 500 includes ablating, with one or more lasers, the exposed surface based at least in part on the one or more laser parameters as described in the present disclosure.

Figure 15:
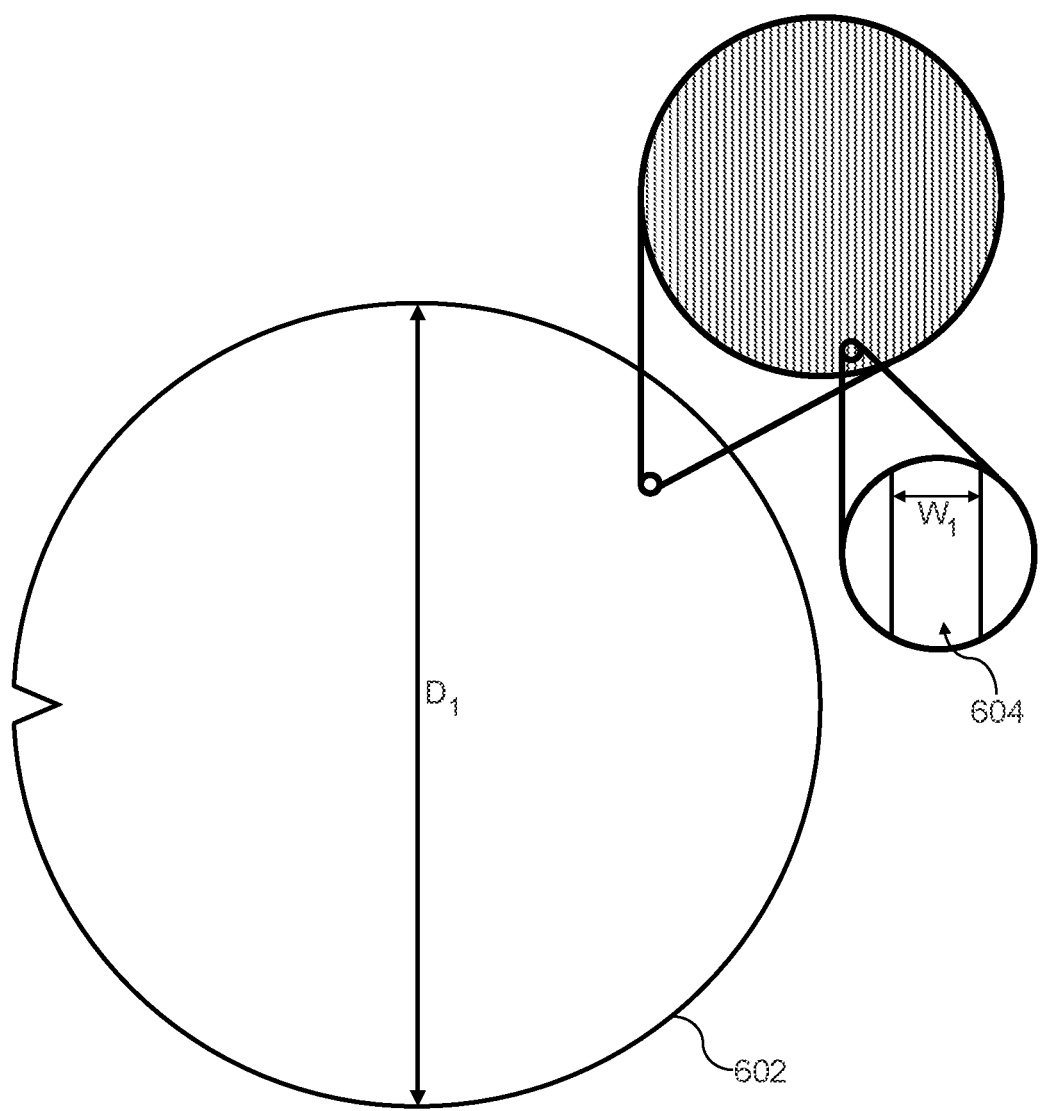
FIG. 15 depicts a semiconductor wafer according to examples of the present disclosure.

FIG. 15 depicts an example silicon carbide semiconductor wafer 600 that has been subjected to a laser-based surface processing operation according to examples of the present disclosure. The semiconductor wafer 600 may include silicon carbide. In some examples, the semiconductor wafer 600 may include, for instance, 4H silicon carbide or 6H silicon carbide.

In some examples, the semiconductor wafer 600 has a diameter D1 in a range of about 100 millimeters to about 300 millimeters, such as in a range of about 100 millimeters to about 200 millimeters, such as about 100 millimeters, such as about 150 millimeters, such as about 200 millimeters. The semiconductor wafer 600 may have thickness of less than about 500 microns, such as less than about 300 microns, such as less than about 200 microns, such as in a range of about 100 microns to about 200 microns, such as in a range of about 120 microns to 180 microns.

The silicon carbide semiconductor wafer 600 may have a laser-defined surface 602. A close-up of the laser-defined surface 602 is shown in FIG. 15. As shown, the laser-defined surface 602 has a plurality of laser-defined scan features arranged in a regular pattern. The regular pattern corresponds to the scanning path of the laser during a laser ablation process. In some examples, the laser-defined scan feature may be a laser-defined strip on the surface where the laser has removed material. Each laser-defined scan feature may have a width w1 corresponding generally to a scan dimension (e.g., spot size) associated with the laser during the laser scan. The width w1 may be in a range of about 10 microns to about 25 millimeters, in some embodiments.

In some embodiments, the laser-defined surface 602 may have a surface roughness in a range of about 20 nanometers to about 65 microns. In some embodiments, the laser-defined surface 602 may have a surface roughness in a range of about 0.5 nanometer to about 180 nanometers, such as about 0.5 nanometer to about 125 nanometers, such as about between about 1 nanometer to about 100 nanometers, such as between about 2 nanometers and about 50 nanometers.

In some examples, there may be a distance between laser-defined scan features in the laser-defined surface. The distance between each scan or pass may be, for instance, in a range of about 0 millimeters to about 1 millimeter, such as about 0 millimeters to about 500 microns. In some examples, there may be no distance between laser-defined scan features in the laser-defined surface. In some examples there may be overlap between laser-defined scan features on the laser-defined surface.

Figure 16:
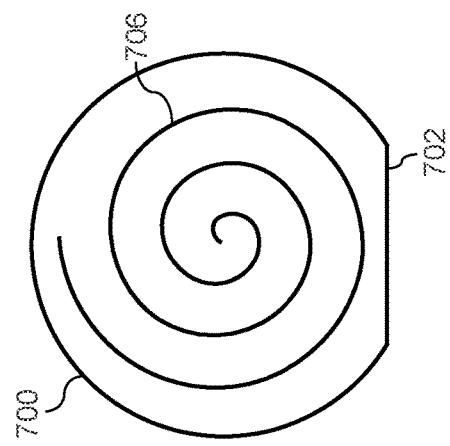
FIGS. 16-22 depicts example scan patterns for a laser-based surface processing operation according to examples of the present disclosure.

According to aspects of the present disclosure, the one or more lasers may scan the surface of a workpiece in any suitable pattern. FIG. 16 depicts an example scan pattern 704 on an example semiconductor wafer 700 (e.g., silicon carbide semiconductor wafer) according to example embodiments of the present disclosure. The scan pattern depicted in FIG. 16 comprises a plurality of parallel scans or passes in a direction generally perpendicular to, for instance, a flat 702 of the semiconductor wafer 700.

Figure 17:
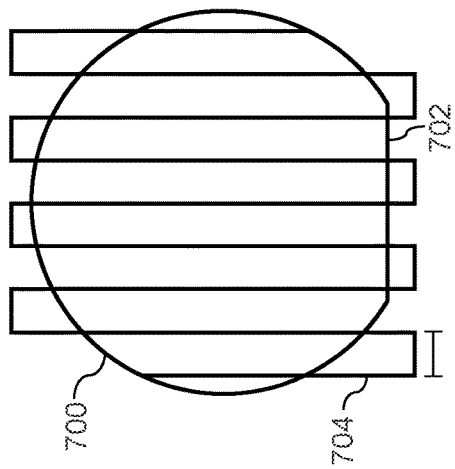

FIG. 17 depicts an example scan pattern 706 on an example semiconductor wafer 700 (e.g., silicon carbide semiconductor wafer) according to example embodiments of the present disclosure. The scan pattern 706 depicted in FIG. 17 comprises a spiral scan pattern on a surface of the semiconductor wafer 700.

Figure 18:
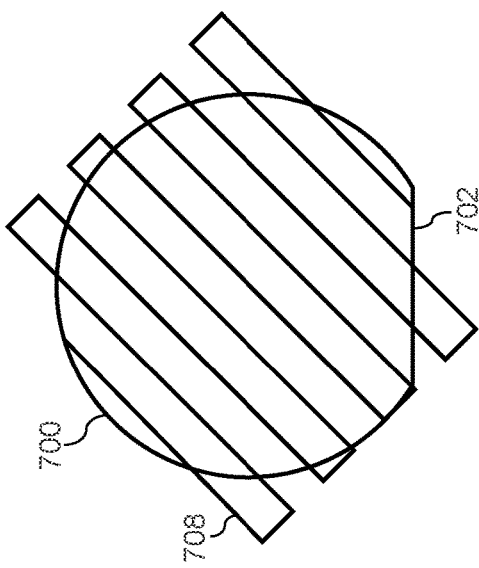

FIG. 18 depicts an example scan pattern 708 on an example semiconductor wafer 700 (e.g., silicon carbide semiconductor wafer) according to example embodiments of the present disclosure. The scan pattern 708 depicted in FIG. 18 comprises a plurality of generally parallel scans or passes in a direction that is angled (not generally perpendicular and not generally parallel) to, for instance, a flat 702 of the semiconductor wafer 700.

Figure 19:
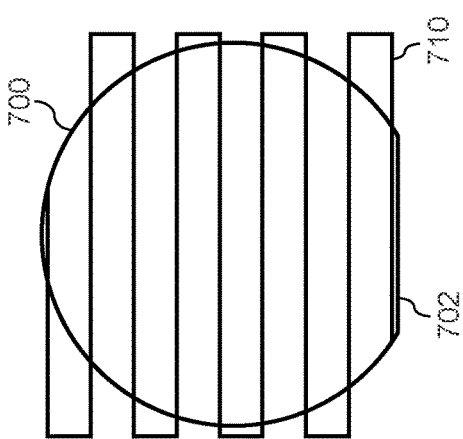

FIG. 19 depicts an example scan pattern 710 on an example semiconductor wafer 700 (e.g., silicon carbide semiconductor wafer) according to example embodiments of the present disclosure. The scan pattern 710 depicted in FIG. 19 comprises a plurality of generally parallel scans or passes in a direction that is generally parallel to, for instance, a flat 702 of the semiconductor wafer 700.

Figure 20:
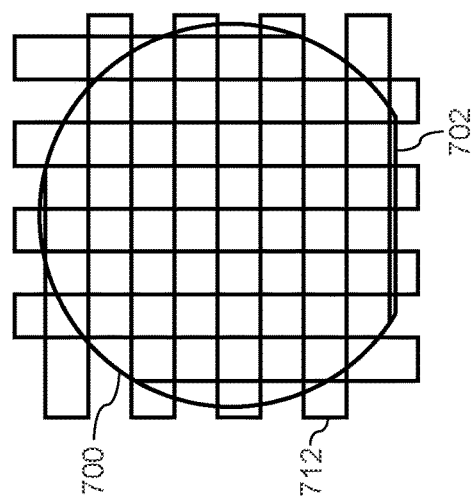

FIG. 20 depicts an example scan pattern 712 on an example semiconductor wafer 700 (e.g., silicon carbide semiconductor wafer) according to example embodiments of the present disclosure. The scan pattern 712 depicted in FIG. 20 comprises a plurality of generally parallel scans or passes and a plurality of generally perpendicular scans or passes to, for instance, a flat 702 of the semiconductor wafer 700.

Other suitable laser scan patterns may be used without deviating from the scope of the present disclosure. For instance, the laser scan pattern may be an irregular or a random scan pattern. As additional non-limiting examples, the laser scan pattern may be a spot pattern, non-continuous pattern, zig zag pattern, herringbone pattern, chevron pattern, array of polygons, concentric circles, or other suitable pattern.

Figure 21:
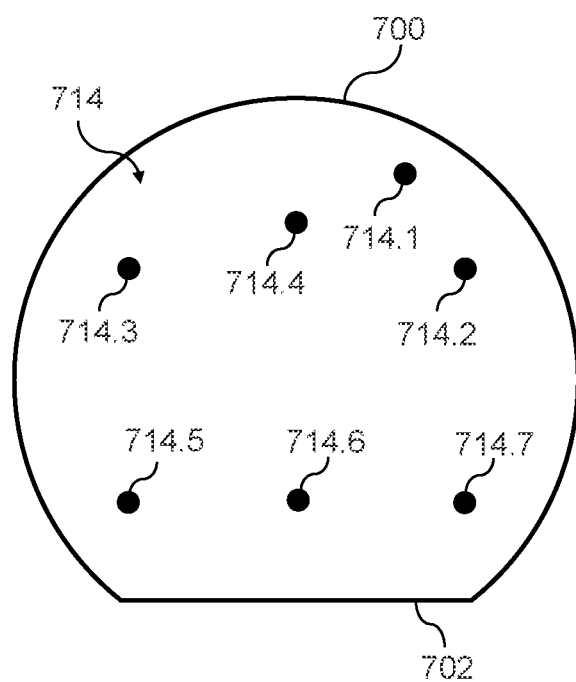

For instance, FIG. 21 depicts an example non-continuous scan pattern 714 on an example semiconductor wafer 700 (e.g., silicon carbide semiconductor wafer) according to example embodiments of the present disclosure. The scan pattern 714 depicted in FIG. 21 includes a plurality of discrete and separated scan points 714.1, 714.2, . . . 714.*n* on the semiconductor wafer 700. For instance, workpiece property data (e.g., sensor data associated with one or more workpiece properties) may indicate the presence of local peak topographical areas on the semiconductor wafer 700. The laser scan pattern 714 can provide emission of the laser on the discrete points 714.1, 714.2, . . . 714.*n* to remove the local peak topographical areas. The discrete points can be in a regular pattern or in a scattered, irregular pattern.

Figure 22:
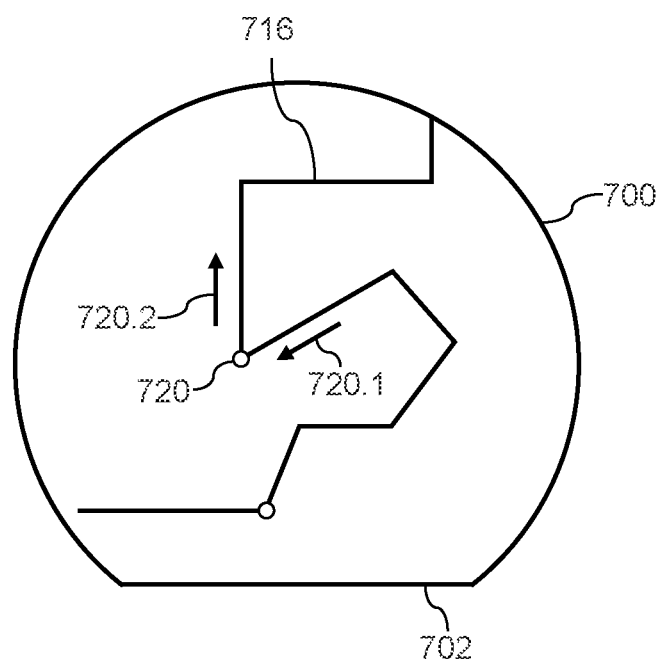

In some embodiments, the scan pattern may be adjusted (e.g., while scanning the semiconductor wafer) based on data, such as sensor data associated with one or more workpiece properties. For instance, FIG. 22 depicts an example scan pattern 718 on an example semiconductor wafer 700 (e.g., silicon carbide semiconductor wafer) according to example embodiments of the present disclosure. The scan pattern 718 has been adjusted, for instance, at point 718 from a first direction 720.1 to a second direction 720.2. In some embodiments, the scan pattern 718 may be adjusted, for instance, based on data associated with one or more workpiece properties. For instance, the scan pattern 718 may change directions to address high surface topographical areas (e.g., peaks) or other features on the surface of the semiconductor wafer 700. The scan pattern 718 may be adjusted based on other factors without deviating from the scope of the present disclosure.

Figure 23:
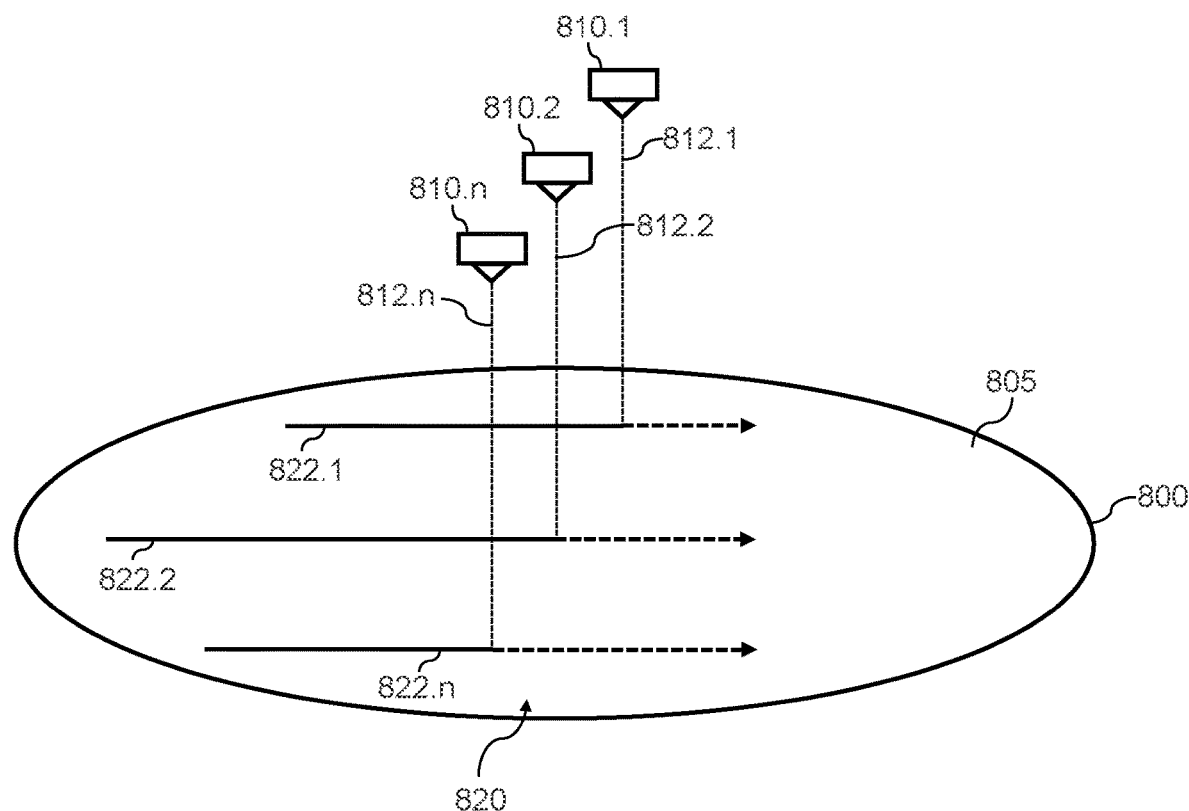
FIG. 23 depicts an array of lasers ablating a surface of a semiconductor workpiece according to examples of the present disclosure.

FIG. 23 depicts an array of laser sources 810.1, 810.2, . . . , 810.*n* providing emission of lasers 812.1, 812.2, . . . , 812.*n* onto a surface 805 of a semiconductor workpiece 800 (e.g., silicon carbide semiconductor wafer) according to examples of the present disclosure. The laser sources 810.1, 810.2, . . . , 810.*n* may each be configured to respectively emit a laser 812.1, 812.2, . . . , 812.*n* in accordance with various laser parameters. The laser parameters may include, for instance, focusing depth, laser power, laser wavelength, laser pulse duration, laser pulse frequency, laser pulse energy, laser incidence angle, laser scan pattern, etc. The laser sources 810.1, 810.2, . . . , 810.*n* may each be the same type of laser source or different types of laser sources. The laser sources 810.1, 810.2, . . . , 810.*n* may be configured to emit lasers 812.1, 812.2, . . . , 812.*n* in accordance with the same laser parameters or different laser parameters.

The laser sources 810.1, 810.2, . . . , 810.*n* may be collectively controlled or independently controlled to implement a scan pattern 820 on the surface 805 of the semiconductor workpiece 800 to implement a laser-based surface processing operation according to examples of the present disclosure. For instance, each laser source 810.1, 810.2, . . . , 810.*n* may be collectively controlled as a group or independently controlled relative to one another to provide individual scans 822.1, 822.2, . . . , 822.*n* to provide a scan pattern 820 on the surface 805 of the semiconductor workpiece 800.

FIG. 23 depicts three laser sources 810.1, 810.2, . . . , 810.*n* for purposes of illustration and discussion. Those of ordinary skill in the art, using the disclosures provided herein, will understand that the system may include more or fewer laser sources without deviating from the scope of the present disclosure.

Example aspects of the present disclosure are set forth below. Any of the below features or examples may be used in combination with any of the embodiments or features provided in the present disclosure.

One example aspect of the present disclosure is directed to a method. The method includes removing a wide bandgap semiconductor wafer from a boule using a removal process. The method includes ablating, with one or more lasers, an exposed surface resulting from the removal process to remove material from the exposed surface, wherein ablating, with one or more lasers, the exposed surface reduces a thickness of semiconductor material by about 25 microns or greater.

In some examples, the exposed surface is a surface of the wide bandgap semiconductor wafer.

In some examples, the exposed surface is a surface of the boule.

In some examples, the removal process includes inducing a subsurface laser damage region in the boule; and separating the wide bandgap semiconductor wafer from the boule along the subsurface laser damage region.

In some examples, after ablating, with one or more lasers, the exposed surface of the boule. The method includes removing a second wide bandgap semiconductor wafer from the boule using the removal process.

In some examples, ablating, with one or more lasers, an exposed surface includes implementing a coarse laser ablation process with the one or more lasers.

In some examples, the coarse laser ablation process removes material from the exposed surface such that the exposed surface has a surface roughness in a range of about 20 nanometers to about 65 microns.

In some examples, the coarse laser ablation process reduces the thickness of semiconductor material by about 25 microns to about 500 microns.

In some examples, ablating, with one or more lasers, an exposed surface comprises implementing a fine laser ablation process.

In some examples, the fine laser ablation process removes material from the exposed surface such that the exposed surface has a surface roughness in a range of about 0.5 nanometer to about 180 nanometers.

In some examples, the fine laser ablation process reduces the thickness of semiconductor material by about 0.1 micron to about 50 microns.

In some examples, the coarse laser ablation process is implemented using a first laser and the fine laser ablation process is implemented using a second laser.

In some examples, the first laser has a longer wavelength relative to the second laser.

In some examples, the first laser is an infrared laser and the second laser is an ultraviolet laser.

In some examples, ablating, with one or more lasers, an exposed surface comprises imparting relative motion between the exposed surface and the one or more lasers.

In some examples, imparting relative motion between the exposed surface and the one or more lasers comprises imparting relative motion between the exposed surface and the one or more lasers such that the one or more lasers scan at least about 85% of the exposed surface.

In some examples, ablating, with one or more lasers, comprises: setting a focal depth of the one or more lasers to a focal depth within about 1000 microns or less beneath a peak height of the exposed surface.

In some examples, ablating, by the one or more lasers, the exposed surface comprises ablating, by the one or more lasers, the exposed surface with one or more lasers having a laser pulse energy in a range of about 10 nanojoules to about 200 millijoules.

In some examples, ablating, by the one or more lasers, the exposed surface comprises: obtaining data indicative of a workpiece property; determining one or more laser parameters based on the data indicative of the workpiece property; and ablating, with the one or more lasers, the exposed surface based at least in part on the one or more laser parameters.

In some examples, the data indicative of the workpiece property comprises a surface topography of at least a portion the exposed surface.

In some examples, the data indicative of the workpiece property is obtained from an optical sensor.

In some examples, obtaining data indicative of the workpiece property is obtained from one or more surface measurement lasers.

In some examples, the data indicative of the property comprises an image.

In some examples, the one or more laser parameters comprise one or more of laser power, laser pulse frequency, laser wavelength, laser pulse duration, focusing depth, laser pulse energy, laser scan pattern, or translation speed.

In some examples, the one or more laser parameters are specified as a function of position on the exposed surface.

In some examples, the wide bandgap semiconductor wafer comprises silicon carbide.

In some examples, the wide bandgap semiconductor wafer comprises a Group III-nitride.

Another example aspect of the present disclosure is directed to a method of processing an exposed surface of a semiconductor material. The method includes obtaining data indicative of a workpiece property. The method includes determining one or more laser parameters based on the data indicative of the workpiece property. The method includes removing semiconductor material from the exposed surface using one or more lasers based at least in part on the laser parameters.

In some examples, the data indicative of the workpiece property comprises a surface topography of at least a portion of the exposed surface.

In some examples, the data indicative of the workpiece property is obtained from an optical sensor.

In some examples, obtaining data indicative of the workpiece property is obtained from one or more surface measurement lasers.

In some examples, the data indicative of the workpiece property comprises an image.

In some examples, the one or more laser parameters comprises one or more of laser power, laser wavelength, laser pulse frequency, laser pulse duration, focusing depth, laser pulse energy, laser scan pattern, or translation speed.

In some examples, the one or more laser parameters are specified as a function of position on the exposed surface.

In some examples, the exposed surface is a surface of a semiconductor wafer.

In some examples, the exposed surface is a surface of a boule.

In some examples, the semiconductor material comprises silicon carbide.

In some examples, the semiconductor material comprises a Group III-nitride.

Another example aspect of the present disclosure is directed to a method of processing an exposed surface of semiconductor material. The method includes providing a semiconductor workpiece having an exposed surface. The method includes providing emission of one or more lasers to the exposed surface to remove material from the exposed surface such that the exposed surface has a surface roughness in a range of about 0.5 nanometer to about 180 nanometers.

In some examples, providing emission of the one or more lasers comprises a first laser ablation process and a second laser ablation process performed after the first laser ablation process, wherein the first laser ablation process removes material from the exposed surface such that the exposed surface has a first surface roughness, wherein the second laser ablation process removes material from the exposed surface such that the exposed surface has a second surface roughness, the second surface roughness being less than the first surface roughness.

In some examples, the first surface roughness is in a range of about 20 nm to about 65 microns, wherein the second surface roughness is in the range of about 0.5 nanometers to about 180 nanometers.

In some examples, the first laser ablation process is implemented using a first laser and the second laser ablation process is implemented using a second laser.

In some examples, the first laser has a longer wavelength relative to the second laser.

In some examples, the first laser is an infrared laser and the second laser is an ultraviolet laser.

In some examples, the exposed surface is a surface of a semiconductor wafer.

In some examples, the exposed surface is a surface of a boule.

In some examples, the semiconductor material comprises silicon carbide or a Group III-nitride.

Another example aspect of the present disclosure is directed to a system for processing an exposed surface of a semiconductor material. The system includes a laser source configured to emit a laser to remove material from an exposed surface of a semiconductor workpiece. The system includes at least one translation stage operable to impart relative motion between the exposed surface of the semiconductor workpiece and the laser. The system includes a sensor operable to obtain data indicative of a workpiece property. The system includes a controller configured to perform operations. The operations include determining one or more laser parameters based on the data indicative of the workpiece property, The operations include controlling the laser to remove material from the exposed surface based at least in part on the laser parameters.

In some examples, the data indicative of the workpiece property comprises a surface topography of at least a portion of the exposed surface.

In some examples, the sensor is an optical sensor.

In some examples, the sensor is a surface measurement laser.

In some examples, the sensor is an image capture device.

In some examples, the one or more laser parameters comprises one or more of laser power, laser wavelength, laser pulse frequency, laser pulse duration, focusing depth, laser pulse energy, laser scan pattern, or translation speed.

In some examples, the one or more laser parameters are specified as a function of position on the exposed surface.

In some examples, the semiconductor workpiece is a semiconductor wafer.

In some examples, the semiconductor workpiece is a boule.

Another example aspect of the present disclosure is directed to a system for processing an exposed surface of a semiconductor material. The system includes a first laser source configured to emit a first laser remove material from an exposed surface of a semiconductor structure. The system includes a second laser source configured to emit a second laser remove material from the exposed surface of the semiconductor structure. The system includes at least one translation stage operable to impart relative motion between the exposed surface of the semiconductor structure and the first laser and between the exposed surface of the semiconductor structure and the second laser. The first laser is associated with a first wavelength and the second laser is associated with a second wavelength that is different than the first wavelength.

In some examples, the first laser has a longer wavelength relative to the second laser.

In some examples, the first laser is an infrared laser and the second laser is an ultraviolet laser.

In some examples, the system includes a sensor operable to obtain data indicative of a workpiece property of the exposed surface. The system includes a controller configured to perform operations. The operations include determining one or more laser parameters based on the data indicative of a workpiece property; and controlling the first laser and the second laser to ablate the exposed surface based at least in part on the laser parameters.

Another example aspect of the present disclosure is directed to a system for forming a wide bandgap semiconductor wafer. The system includes a workpiece support configured to support a semiconductor workpiece. The system includes a first laser source configured to emit a first laser to remove a portion of semiconductor material from the semiconductor workpiece using a removal process. The system includes a second laser source configured to emit a second laser to ablate an exposed surface of the semiconductor workpiece resulting from the removal process.

In some examples, the first laser is further configured to induce a subsurface laser damage region in the semiconductor workpiece.

In some examples, the second laser is further configured to implement a coarse laser ablation process.

In some examples, the second laser is further configured to remove material from the exposed surface such that the exposed surface has a surface roughness in a range of about 20 nanometers to about 65 microns.

In some examples, the system includes a third laser source configured to emit a third laser to implement a fine laser ablation process to remove material from the exposed surface.

In some examples, the third laser is further configured to remove material from the exposed surface such that the exposed surface has a surface roughness in a range of about 0.5 nanometer to about 180 nanometers.

In some examples, the first laser has different laser parameters relative to the second laser.

In some examples, the system includes a controller configured to: obtain data indicative of a workpiece property; determine one or more laser parameters based on the data indicative of the workpiece property; and control the second laser to ablate the exposed surface based at least in part on the one or more laser parameters.

In some examples, the one or more laser parameters comprises one or more of laser power, laser wavelength, laser pulse frequency, laser pulse duration, focusing depth, laser pulse energy, or translation speed.

In some examples, the one or more laser parameters are determined as a function of position on the exposed surface.

Another example aspect of the present disclosure is directed to a semiconductor wafer. The semiconductor wafer includes silicon carbide. The semiconductor wafer includes a laser-defined surface. The laser-defined surface has a surface roughness in a range of about 0.5 nanometer to about 180 nanometers.

In some examples, the laser-defined surface has a plurality of laser-defined scan features arranged in a regular pattern.

In some examples, the plurality of laser-defined scan features comprise one or more ablated strips.

In some examples, the semiconductor wafer has a diameter of about 150 millimeters.

In some examples, the semiconductor wafer has a diameter of about 200 millimeters.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method, comprising:
    removing a wide bandgap semiconductor wafer from a boule using a removal process;
    ablating, with one or more lasers, an exposed surface resulting from the removal process to remove material from the exposed surface such that the exposed surface has a surface roughness in a range of about 0.5 nanometers to about 65 microns, wherein ablating, with one or more lasers, the exposed surface reduces a thickness of semiconductor material by about 25 microns or greater.

2. The method of claim 1, wherein the exposed surface is a surface of the wide bandgap semiconductor wafer or is a surface of the boule.

3. The method of claim 1, wherein the removal process comprises:
    inducing a subsurface laser damage region in the boule; and
    separating the wide bandgap semiconductor wafer from the boule along the subsurface laser damage region.

4. The method of claim 3, wherein after ablating, with one or more lasers, the exposed surface of the boule, the method comprises removing a second wide bandgap semiconductor wafer from the boule using the removal process.

5. The method of claim 1, wherein ablating, with one or more lasers, an exposed surface comprises implementing a coarse laser ablation process with the one or more lasers, wherein the coarse laser ablation process removes material from the exposed surface such that the exposed surface has a surface roughness in a range of about 20 nanometers to about 65 microns.

6. The method of claim 5, wherein the coarse laser ablation process reduces the thickness of semiconductor material by about 25 microns to about 500 microns.

7. The method of claim 5, wherein ablating, with one or more lasers, an exposed surface comprises implementing a fine laser ablation process, wherein the fine laser ablation process removes material from the exposed surface such that the exposed surface has a surface roughness in a range of about 0.5 nanometer to about 180 nanometers.

8. The method of claim 7, wherein the fine laser ablation process reduces the thickness of semiconductor material by about 0.1 micron to about 50 microns.

9. The method of claim 7, wherein the coarse laser ablation process is implemented using a first laser and the fine laser ablation process is implemented using a second laser.

10. The method of claim 9, wherein the first laser has a longer wavelength relative to the second laser.

11. The method of claim 10, wherein the first laser is an infrared laser and the second laser is an ultraviolet laser.

12. The method of claim 1, wherein ablating, by the one or more lasers, the exposed surface comprises ablating, by the one or more lasers, the exposed surface with one or more lasers having a laser pulse energy in a range of about 10 nanojoules to about 200 millijoules.

13. The method of claim 1, wherein the wide bandgap semiconductor wafer comprises silicon carbide or a Group III-nitride.

14. A method, comprising:
    removing a wide bandgap semiconductor wafer from a boule using a removal process;
    ablating, with one or more lasers, an exposed surface resulting from the removal process to remove material from the exposed surface, wherein ablating, with one or more lasers, the exposed surface reduces a thickness of semiconductor material by about 25 microns or greater;
    wherein the ablating, by the one or more lasers, the exposed surface comprises:
        obtaining data indicative of a workpiece property;
        determining one or more laser parameters based on the data indicative of the workpiece property; and
        ablating, with the one or more lasers, the exposed surface based at least in part on the one or more laser parameters.

15. The method of claim 14, wherein the data indicative of the workpiece property comprises a surface topography of at least a portion the exposed surface.

16. The method of claim 14, wherein the data indicative of the workpiece property is obtained from an optical sensor or one or more surface measurement lasers.

17. The method of claim 14, wherein the data indicative of the workpiece property comprises an image.

18. The method of claim 14, wherein the one or more laser parameters comprise one or more of laser power, laser pulse frequency, laser wavelength, laser pulse duration, focusing depth, laser pulse energy, laser scan pattern, or translation speed.

19. The method of claim 14, wherein the one or more laser parameters are specified as a function of position on the exposed surface.

20. The method of claim 14, wherein the data indicative of the workpiece property comprises an optical property.

21. A method, comprising:
- removing a wide bandgap semiconductor wafer from a boule using a removal process;
- ablating, with one or more lasers, an exposed surface resulting from the removal process to remove material from the exposed surface, wherein ablating, with one or more lasers, the exposed surface reduces a thickness of semiconductor material by about 25 microns or greater;
- wherein ablating, with one or more lasers, comprises setting a focal depth of the one or more lasers to a focal depth within about 1000 microns or less beneath a peak height of the exposed surface.

* * * * *